(12) United States Patent
Oda

(10) Patent No.: US 8,390,761 B2
(45) Date of Patent: Mar. 5, 2013

(54) DISPLAY DEVICE AND ELECTRONIC APPARATUS

(75) Inventor: Toshihiro Oda, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 65 days.

(21) Appl. No.: 13/180,139

(22) Filed: Jul. 11, 2011

(65) Prior Publication Data

US 2012/0025226 A1 Feb. 2, 2012

(30) Foreign Application Priority Data

Jul. 27, 2010 (JP) ................................. 2010-168668

(51) Int. Cl.
*G02F 1/1335* (2006.01)

(52) U.S. Cl. ................ 349/61; 349/41; 349/50; 349/51; 349/52; 349/62

(58) Field of Classification Search .............. 349/41, 349/50, 51, 52, 61, 62
See application file for complete search history.

(56) References Cited

U.S. PATENT DOCUMENTS

| 6,863,961 | B2 | 3/2005 | Miyashita et al. |
| 7,221,332 | B2 * | 5/2007 | Miller et al. ................. 345/32 |
| 7,528,810 | B2 * | 5/2009 | Ohshima et al. ............. 345/77 |
| 2008/0061703 | A1 * | 3/2008 | Le Roy et al. ............ 315/169.3 |

FOREIGN PATENT DOCUMENTS

JP  A-2007-73532  3/2007

* cited by examiner

*Primary Examiner* — Jennifer Doan
(74) *Attorney, Agent, or Firm* — Oliff & Berridge, PLC

(57) ABSTRACT

A display device includes a first light-emitting element which includes a second layer having the function of flowing carriers and provided between a first anode and a first layer having the function of emitting light of a first color, and a third layer having the function of emitting light of a second color and provided between the first anode and the second layer; and a second light-emitting element which includes a fifth layer having the function of suppressing a flow of carriers and provided between a second anode and a fourth layer having the function of emitting light of the first color, and a first hole injection layer provided between the second anode and the fifth layer.

15 Claims, 10 Drawing Sheets

EXAMPLES 1 AND 2

COMPARATIVE EXAMPLE 1

COMPARATIVE EXAMPLES 4R AND 7R

COMPARATIVE EXAMPLES 4G AND 7G

COMPARATIVE EXAMPLES 4B AND 7B

COMPARATIVE EXAMPLE 5B

COMPARATIVE EXAMPLE 6B

DISPLAY DEVICE AND ELECTRONIC APPARATUS

This application claims priority to Japanese Application Number 2010-168668 filed in Japan on Jul. 27, 2010, the entire disclosure of which is hereby incorporated by reference in its entirety.

BACKGROUND

1. Technical Field

The present invention relates to a display device and an electronic apparatus.

2. Related Art

There have been proposed display devices in which in producing organic electroluminescence elements (so-called organic EL elements), a red light-emitting layer and a green light-emitting layer provided in organic EL elements which emit lights of respective colors are formed by a coating method, and a blue light-emitting layer is formed by a vacuum deposition method (evaporation method) (refer to, for example, Japanese Unexamined Patent Application Publication No. 2007-73532).

This technique focuses attention on the point that red light- and green light-emitting organic EL elements formed by a coating method such as an ink jet method have practical levels of emission life (luminance life) and luminous efficiency (current efficiency or external quantum efficiency), but a blue light-emitting organic EL element formed by a coating method often has an emission life and luminous efficiency below practical levels, while a blue light-emitting organic EL element formed by a vacuum deposition method often has an emission life of several times or more as long as that of the blue light-emitting organic EL element formed by the coating method and thus has a practical level of emission life. That is, even when the emission life and luminous efficiency of a color light-emitting organic EL element formed by a liquid-phase process such as an ink jet method are below practical levels, the same color light-emitting organic EL element formed by a vapor-phase process such as a vacuum deposition method may have practical levels of emission life and luminous efficiency.

In such a display device, a red organic EL element (red pixel) and a green organic EL element (green pixel) have a configuration in which a blue light-emitting layer is formed by a vacuum deposition method on a red light-emitting layer and a green light-emitting layer possessed by the respective organic EL elements. That is, the blue light-emitting layer is formed over the entire surface including the red light-emitting layer and the green light-emitting layer by the vacuum deposition method. Therefore, a method for producing a display device having a such configuration is optimum for producing a display device including a large panel because of no need for depositing the blue light-emitting layer selectively only in a blue organic EL element (blue pixel) using a high-definition mask.

However, in this case, since the blue light-emitting layer is provided in contact with the red light-emitting layer and the green light-emitting layer in the red organic EL element and the green organic EL element, respectively, electrons are often not sufficiently injected to the red light-emitting layer and the green light-emitting layer from the blue light-emitting layer.

Therefore, in the red organic EL element (red pixel) and the green organic EL element (green pixel), light may be undesirably emitted from the blue light-emitting layer, thereby decreasing color purities of read and green colors.

Namely, in a light-emitting element including a plurality of layers (light-emitting function layers) having the function of emitting light which are provided between a cathode and an anode, there is a problem that light cannot be selectively or dominantly emitted from a desired layer among the layers having the function of emitting light.

SUMMARY

An advantage of some aspects of the invention is that the invention provides a display device capable of selectively or dominantly emitting light from a desired layer among a plurality of layers having the light-emitting function, the plurality of layers being provided between a cathode and an anode in a light-emitting element, and also provides an electronic apparatus.

A display device according to an embodiment of the present invention includes a first light-emitting element and a second light-emitting element. The first light-emitting element includes a first anode, a cathode, a first layer provided between the first anode and the cathode and having the function of emitting light of a first color, a second layer provided between the first anode and the first layer and having the function of flowing carriers, and a third layer provided between the first anode and the second layer and having the function of emitting light of a second color. The second light-emitting element includes a second anode, the cathode provided in common to the first light-emitting element, a fourth layer provided between the second anode and the cathode and having the function of emitting light of the first color, a fifth layer provided between the second anode and the fourth layer and having the function of suppressing a flow of carriers, and a first hole injection layer provided between the second anode and the fifth layer.

Therefore, in the first light-emitting element, light can be selectively emitted from the third layer because a carrier flow is smoothened by the second layer, and thus the first light-emitting element emits light of the second color. In the second light-emitting element, light can be emitted from the first layer because a carrier flow is suppressed by the fifth layer, and thus the second light-emitting element emits light of the first color.

In the display device according to the embodiment of the present invention, the second layer preferably includes a first hole-transport layer disposed on the cathode side and a first electron-injection layer disposed on the first anode side. Consequently, the function of the second layer is securely exhibited.

In the display device according to the embodiment of the present invention, the fifth layer preferably includes a second hole-transport layer disposed on the cathode side and a second electron-injection layer disposed on the second anode side. Consequently, the function of the fifth layer is securely exhibited.

In the display device according to the embodiment of the present invention, preferably, the first and second hole-transport layers are integrally provided, and the first and second electron-injection layers are integrally provided. Therefore, the area of the display device can be easily increased.

In the display device according to the embodiment of the present invention, preferably, the first and fourth layers are integrally provided. Therefore, the area of the display device can be easily increased.

In the display device according to the embodiment of the present invention, the first and second electron injection layers are preferably composed of an alkali metal, an alkaline-earth metal, or a compound thereof.

Consequently, in the first light-emitting element, the performance of electron injection from the first layer to the third layer through the first hole-transport layer and the first electron-injection layer can be improved. Further, in the second light-emitting element, diffusion of the material constituting the second electron-injection layer to the fourth layer side can be accurately suppressed.

In the display device according to the embodiment of the present invention, the first hole-injection layer preferably has ionic conductivity. Also, the first hole-injection layer preferably has ionic conductivity.

In the display device according to the embodiment of the present invention, the first and fourth layers are preferably formed by a vapor-phase process.

A light-emitting element provided with a fourth layer formed by the vapor-phase process sufficiently has a practical level of emission life characteristic.

In the display device according to the embodiment of the present invention, the second hole-transport layer is preferably formed by a vapor-phase process.

A light-emitting element provided with a second hole-transport layer formed by a vapor-phase process has a good emission life characteristic as compared with a light-emitting element provided with a second hole-transport layer formed by a liquid-phase process.

In the display device according to the embodiment of the present invention, the third layer is preferably formed by a liquid-phase process. The area of a display device including a third layer formed by the liquid-phase process can be easily increased.

In the display device according to the embodiment of the present invention, the first hole-injection layer is preferably formed by a liquid-phase process. The area of a display device including a first hole injection layer formed by the liquid-phase process can be easily increased.

In the display device according to the embodiment of the present invention, the first color is preferably blue.

Therefore, the display device according to the embodiment of the present invention can be preferably applied to a display device including a first light-emitting element which includes a first layer having the function of emitting blue light, and a second light-emitting element which includes a fourth layer having the function of emitting blue light.

In the display device according to the embodiment of the present invention, the second color is preferably either red or green.

Therefore, the display device according to the embodiment of the present invention is preferably applied to a display device including a first light-emitting element which includes a third layer having the function of emitting red or green light.

In the display device according to the embodiment of the present invention, preferably, the first light-emitting element functions as a light-emitting element which emits light of the second color, and the second light-emitting element functions as a light-emitting element which emits light of the first color.

An electronic apparatus according to an embodiment of the present invention includes a display device according to an embodiment of the present invention. Therefore, an electronic apparatus with high reliability can be produced.

BRIEF DESCRIPTION OF THE DRAWINGS

The invention will be described with reference to the accompanying drawings, wherein like numbers reference like elements.

DETAILED DESCRIPTION OF EMBODIMENTS

A display device and an electronic apparatus are described with reference to preferred embodiments of the present invention shown in the attached drawings. In the embodiments, examples, and comparative examples, the term "luminous efficiency" represents a current efficiency or external quantum efficiency.

(Display Device)

First, a display device according to an embodiment of the present invention is described.

Hereinafter, a display device according to an embodiment of the present invention is described as an example.

Figure 1:
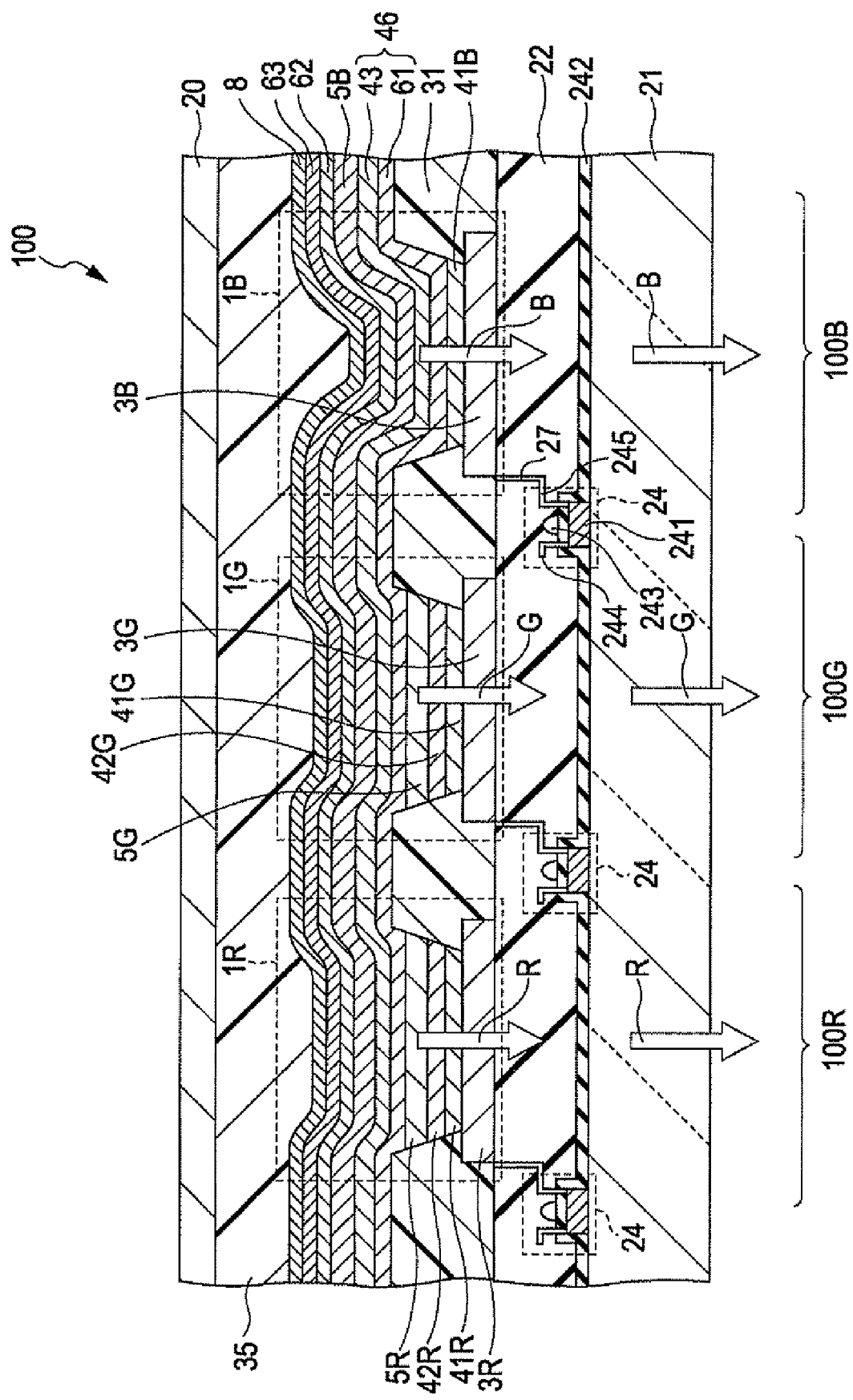
FIG. 1 is a longitudinal sectional view showing a display device according to an embodiment of the present invention.

FIG. 1 is a longitudinal sectional view showing a display device according to an embodiment of the present invention.

A display device 100 shown in FIG. 1 includes a substrate 21, a plurality of light-emitting elements 1R, 1G, and 1B provided to correspond to sub-pixels 100R, 100G, and 100B, respectively, and a plurality of driving transistors 24 provided for driving the respective light-emitting elements 1R, 1G, and 1B.

In this embodiment, the display device 100 is applied to a display panel with a bottom-emission structure in which lights R, G, and B emitted from the light-emitting elements 1R, 1G, and 1B, respectively, are transmitted through the substrate 21 side.

The plurality of driving transistors 24 are provided on the substrate 21, and a planarization layer 22 composed of an insulating material is formed to cover the driving transistors 24.

Each of the driving transistors 24 includes a semiconductor layer 241 composed of a semiconductor material such as silicon, a gate insulating layer 242 formed on the semiconductor layer 241, a gate electrode 243 formed on the gate insulating layer 242, a source electrode 244, and a drain electrode 245.

Also, the light-emitting elements (organic EL elements) 1R, 1G, and 1B are provided on the planarization layer 22 to correspond to the respective driving transistors 24.

Each of the light-emitting elements 1R, 1G, and 1B includes a first layer, a second layer, and a third layer which are provided between each of the anodes 3R, 3G, and 3B and the cathode 8 in that order from the cathode 8 side.

The first layer is a layer having the function of emitting light of a first color. Hereinafter, a layer having the function of emitting light of a color is referred to as a "light-emitting function layer". In the embodiment, the first color is blue, and the first layer is a blue light-emitting function layer 5B.

The second layer is a carrier selection layer 46. The carrier selection layer is a layer having the function of selecting a carrier flow depending on the function of the third layer. Hereinafter, a layer having the function of selecting a carrier flow depending on the function of the third layer is referred to as a "carrier selection layer". In the embodiment, the carrier selection layer 46 includes a laminate of a first electron injection layer 61 and a hole transport layer 43 which are laminated in that order from the anode (3R, 3G, 3B) side.

In the light-emitting elements 1R and 1G, the third layers are layers having the function of emitting light of a second color, i.e., a red light-emitting function layer 5R and a green light-emitting function layer 5G, respectively. That is, in the embodiment, the second colors in the light-emitting elements 1R and 1G are red and green, respectively.

In the light-emitting element 1B, the third layer is a hole injection layer 41B.

In the light-emitting element 1R, the anode 3R, the hole injection layer 41R, an intermediate layer 42R, the red light-emitting function layer 5R as the third layer, the carrier selection layer 46 as the second layer, the blue light-emitting function layer 5B as the first layer, an electron transport layer 62, a second electron injection layer 63, and the cathode 8 are laminated in that order on the planarization layer 22.

In the light-emitting element 1G, the anode 3G, the hole injection layer 41G, the intermediate layer 42G, the green light-emitting function layer 5G as the third layer, the carrier selection layer 46 as the second layer, the blue light-emitting function layer 5B as the first layer, the electron transport layer 62, the second electron injection layer 63, and the cathode 8 are laminated in that order on the planarization layer 22.

Further, in the light-emitting element 1B, the anode 3B, the hole injection layer 41B as the third layer, the carrier selection layer 46 as the second layer, the blue light-emitting function layer 5B as the first layer, the electron transport layer 62, the second electron injection layer 63, and the cathode 8 are laminated in that order on the planarization layer 22.

In addition, a partition wall 31 is provided between the adjacent light-emitting elements 1R, 1G, and 1B configured as described above so that the light-emitting elements 1R, 1G, and 1B are separately provided.

In the embodiment, in the respective light-emitting elements 1R, 1G, and 1B, the anodes 3R, 3G, and 3B, the hole injection layers 41R, 41G, and 41B, the intermediate layers 42R and 42G, and the light-emitting function layers 5R and 50 are separately provided by partitioning by the partition wall 31. However, each of the first electron injection layer 61, the hole transport layer 43, the blue light-emitting function layer 5B, the electron transport layer 62, the second electron injection layer 63, and the cathode 8 is integrally provided. In this configuration, the anodes 3R, 3G, and 3B of the light-emitting elements 1R, 1G, and 1B form pixel electrodes (individual electrodes), and the cathode 8 of the light-emitting elements 1R, 1G, and 1B forms a common electrode. In addition, the anodes 3R, 3G, and 3B of the light-emitting elements 1R, 1G, and 1B are electrically connected to the drain electrodes 245 of the respective driving transistors 24 through conductive portions (wiring) 27.

Therefore, in the display device 100 including the light-emitting elements 1R, 1G, and 1B, the light emission luminance of each of the light-emitting elements 1R, 1G, and 1B is controlled with the driving transistor 24, i.e., a voltage applied to each of the light-emitting elements 1R, 1G, and 1B is controlled, so that a full-color display can be realized by the display device 100.

Details of the light-emitting elements 1R, 1G, and 1B configured as described above are described later.

Further, in the embodiment, an epoxy layer 35 composed of an epoxy resin is formed to cover the light-emitting elements 1R, 1G, and 1B.

Further, a sealing substrate 20 is provided on the epoxy layer 35 to cover it. Therefore, it is possible to secure air tightness of the light-emitting elements 1R, 1G, and 1B and prevent the entrance of oxygen and moisture, thereby improving reliability of the light-emitting elements 1R, 1G, and 1B.

The above-described display device 100 is capable of performing monochrome display by simultaneously emitting lights from the light-emitting elements 1R, 1G, and 1B and performing full-color display by emitting lights from combinations of the light-emitting elements 1R, 1G, and 1B.

The light-emitting elements 1R, 1G, and 1B are described in order below.

(Light-Emitting Element 1R)

The light-emitting element (red light-emitting element) 1R includes a laminate of the hole injection layer 41R, the intermediate layer 42R, the red light-emitting function layer 5R, the carrier selection layer 46, the blue light-emitting function layer 5B, the electron transport layer 62, and the second electron injection layer 63 which are laminated between the anode 3R and the cathode 8 in that order from the anode 3R side.

In the light-emitting element 1R, the carrier selection layer 46 includes a laminate of the first electron injection layer 61 and the hole transport layer 43 which are laminated in that order from the anode 3R side. In addition, in the light-emitting element 1R, the anode 3R and the cathode 8 constitute the individual electrode and the common electrode, respectively, the anode 3R functioning as an electrode which injects holes into the hole injection layer 41R, and the cathode 8 functioning as an electrode which injects electrons into the electron transport layer 62 through the second electron injection layer 63.

The portions constituting the light-emitting element 1R are described in order below.

[Anode 3R]

The anode 3R is an electrode which injects holes into the hole injection layer 41R. The constituent material of the anode 3R is not particularly limited, but a material with large work function and good conductivity is preferably used.

Examples of the constituent material of the anode 3R include metal oxides such as ITO (Indium Tin Oxide), IZO (Indium Zinc Oxide), $In_2O_3$, $SnO_2$, fluorine-doped $SnO_2$, Sb-doped $SnO_2$, ZnO, Al-doped ZnO, Ga-doped ZnO, and the like; and Au, Pt, Ag, and Cu or alloys thereof. These can be used alone or in combination of two or more.

The average thickness of the anode R3 is not particularly limited but is preferably about 10 nm or more and 200 nm or less and more preferably about 30 nm or more and 150 nm or less.

When the display device 100 is used as a display panel with a bottom-emission structure, a light-transmissive metal oxide among the above-described constituent materials is preferably used because the anode 3R is required to be light-transmissive.

[Hole Injection Layer 41R]

The hole injection layer 41R has the function of facilitating hole injection from the anode 3R. The constituent material (hole-injecting material) of the hole injection layer 41R is not particularly limited, but an ion-conducting hole-injecting material including a conductive polymer material (or a conductive oligomer material) doped with an electron-accepting dopant is preferably used for permitting the hole injection layer 41R to be formed by a liquid-phase process in a step of forming the hole injection layer 41R described below.

Examples of the ion-conducting hole-injecting material include polythiophene-based hole-injecting materials such as poly(3,4-ethylenedioxythiophene)-poly(styrenesulfonic acid) (PEDOT/PSS), polyaniline-based hole-injecting materials such as polyaniline-poly(styrenesulfonic acid) (PANI/PSS), and oligoaniline-based hole-injecting materials each including a salt formed by an oligoaniline derivative represented by general formula (1) below and an electron-accepting dopant represented by general formula (4) below.

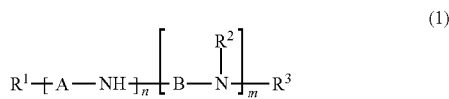

(1)

In the formula, $R^1$, $R^2$, and $R^3$ each independently represent an unsubstituted or substituted monovalent hydrocarbon group or organoxy group, A and B each independently represent a divalent group represented by general formula (2) or (3) below (wherein $R^4$ to $R^{11}$ each independently represent a hydrogen atom, a hydroxyl group, an unsubstituted or substituted monovalent hydrocarbon group or organoxy group, an acyl group, or a sulfonic acid group), and m and n are each independently a positive number of 1 or more and satisfy $m+n \leq 20$.

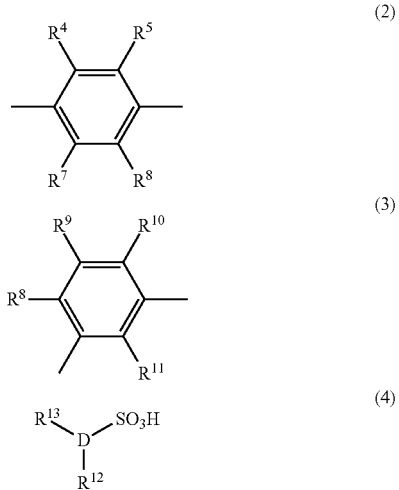

In the formula, D represents a benzene ring, a naphthalene ring, an anthracene ring, a phenanthrene ring, or a heterocyclic ring, and $R^{12}$ and $R^{13}$ each independently represent a carboxyl group or a hydroxyl group.

The average thickness of the hole injection layer is not limited but is preferably about 5 nm or more and 150 nm or less and more preferably about 10 nm or more and 100 nm or less.

The hole injection layer 41R may be omitted according to combinations of the types of the constituent materials and thicknesses of the anode 3R, the intermediate layer 42R, and the red light-emitting function layer 5R which constitute the light-emitting element 1R.

[Intermediate Layer 42R]

The intermediate layer 42R has the function of transporting, to the red light-emitting function layer 5R, the holes injected from the hole injection layer 41R. The intermediate functional layer 42R also has the function of blocking electrons which try to pass through the intermediate layer 42R from the red light-emitting function layer 5R.

The constituent material of the intermediate layer 42R is not particularly limited, but, for example, an amine compound such as a triphenylamine polymer represented by general formula (5) below is preferably used so that the intermediate layer 42R can be formed using a liquid-phase process in the step of forming the intermediate layer 42R described below.

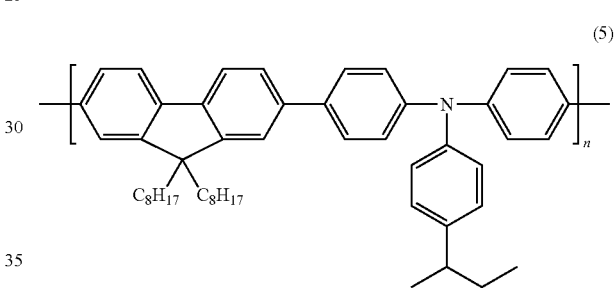

(5)

The average thickness of the intermediate layer 42R is not particularly limited but is preferably about 5 nm or more and 100 nm or less and more preferably about 10 nm or more and 50 nm or less.

The intermediate layer 42R may be omitted according to combinations of the types of the constituent materials and thicknesses of the anode 3R, the hole injection layer 41R, the red light-emitting function layer 5R, the first electron injection layer 61, the hole transport layer 43, the blue light-emitting function layer 5B, the electron transport layer 62, the second electron injection layer 63, and the cathode 8 which constitute the light-emitting element 1R.

[Red Light-Emitting Function Layer 5R]

The red light-emitting function layer 5R is composed of a red light-emitting material which emits red light.

In the light-emitting element 1R, the red light-emitting function layer 5R constitutes the third layer provided between the anode 3R and the carrier selection layer (second layer) 46 and has the function of emitting light of the second color (red).

The constituent material of the red light-emitting function layer 5R is not particularly limited, but the constituent material can be preferably dissolved or dispersed in a solution so that the red light-emitting function layer 5R can be formed using a liquid-phase process in the step of forming the red light-emitting function layer 5R described below. Therefore, as the constituent material of the red light-emitting function layer 5R, a red light-emitting polymer material and red light-emitting low-molecular-weight material can be preferably used because they can be dissolved or dispersed in a solvent or a dispersion medium, For example, red light-emitting polymer materials represented by general formulae (6) and (7) below are used.

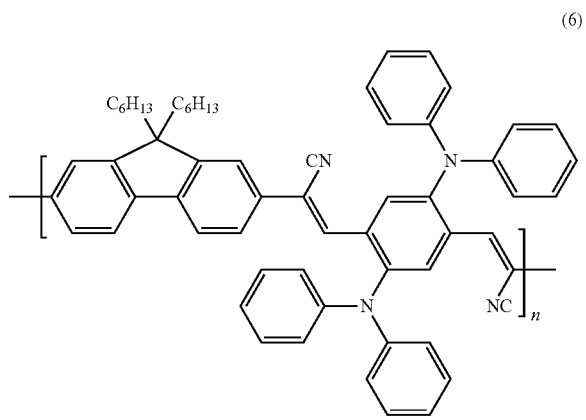

(6)

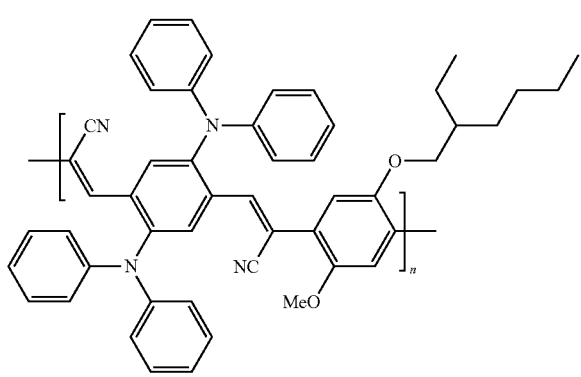

(7)

The light-emitting element 1R provided with the red light-emitting function layer 5R formed through the liquid-phase process sufficiently has a practical level of emission life characteristic.

The average thickness of the red light-emitting function layer 5R is not particularly limited but is preferably about 10 nm or more and 150 nm or less and more preferably about 20 nm or more and 100 nm or less.

[Carrier Selection Layer 46]

The carrier selection layer (second layer) 46 includes a laminate of the first electron injection layer 61 and the hole transport layer 43 which are laminated in that order from the anode 3R side.

In the light-emitting element 1R, the carrier selection layer 46 performs a carrier injecting operation of smoothly injecting electrons into the red light-emitting function layer 5R, the electrons flowing from the blue light-emitting function layer 5B to the carrier selection layer 46. Therefore, in the light-emitting element 1R, light emission from the blue light-emitting function layer 5B is significantly suppressed, and the red light-emitting function layer 5R selectively or dominantly emits light.

[First Electron Injection Layer 61]

The first electron injection layer 61 is one of the layers constituting the carrier selection layer 46 and is in contact with the red light-emitting function layer 5R.

Examples of the constituent material of the first electron injection layer 61 include electron-injecting materials such as alkali metals, alkaline-earth metals, rare earth metals, alkali metal salts (oxides, fluorides, chlorides, and the like), alkaline-earth metal salts (oxides, fluorides, chlorides, and the like), rare earth metal salts (oxides, fluorides, chlorides, and the like), metal complexes, and the like. These materials can be used alone or in combination of two or more.

When the first electron injection layer 61 is composed of such an electron-injecting material as a main material, the efficiency of electron injection from the blue light-emitting function layer 5B to the red light-emitting function layer 5R through the carrier selection layer 46 can be improved.

Examples of the alkali metals include Li, Na, K, Rb, and Cs. Examples of the alkaline-earth metals include Mg, Ca, Sr, and Ba. Examples of the rare earth metals include Nd, Sm, Y, Tb, and Eu.

Examples of the alkali metal salts include LiF, $Li_2CO_3$, LiCl, NaF, $Na_2CO_3$, NaCl, CsF, $Cs_2CO_3$, and CsCl. Examples of the alkaline-earth metal salts include $CaF_2$, $CaCO_3$, $SrF_2$, $SrCO_3$, $BaF_2$, and $BaCO_3$. Examples of the rare earth metal salts include $SmF_3$ and $ErF_3$.

Examples of the metal complexes include organic metal complexes such as 8-quinolinolato lithium (Liq), tris(8-quinolinolato) aluminum ($Alq_3$), and the like, which include 8-quinolinol or derivatives thereof as ligands.

A process for forming the first electron injection layer 61 may use a vapor-phase process such as a vacuum deposition method (evaporation method) or a sputtering method, or a liquid-phase process such as an ink jet method or a slit coating method.

Further, the first electron injection layer 61 may be formed by laminating two or more electron injection layers. In this case, the carrier injection operation of the carrier selection layer 46 is accurately performed in the light-emitting element 1R.

The average thickness of the first electron injection layer 61 is not particularly limited but is preferably about 0.01 nm or more and 10 nm or less and more preferably about 0.1 nm or more and 5 nm or less. With the first electron injection layer 61 having an average thickness in this range, the carrier injection operation of the carrier selection layer 46 is accurately performed in the light-emitting element 1R.

[Hole Transport Layer 43]

The hole transport layer 43 is one of the layers constituting the carrier selection layer 46 and is in contact with the blue light-emitting function layer 5B.

The constituent material of the hole transport layer 43 is not particularly limited, but amine compounds such as benzidine derivatives, e.g., N,N'-diphenyl-N,N'-di(m-tolyl)-benzidine (TPD), bis[N-(1-naphthyl)-N-phenyl]benzidine (α-NPD) represented by formula (8) below, and a compound represented by formula (9) below, are used so that the hole transport layer 43 can be formed using a vapor-phase process such as a vacuum deposition method in the step of forming the hole transport layer 43 described below. These compounds can be used alone or in combination of two or more.

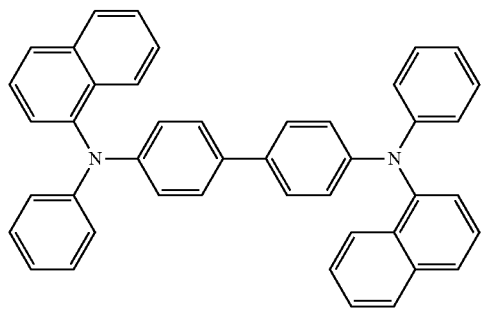

(8)

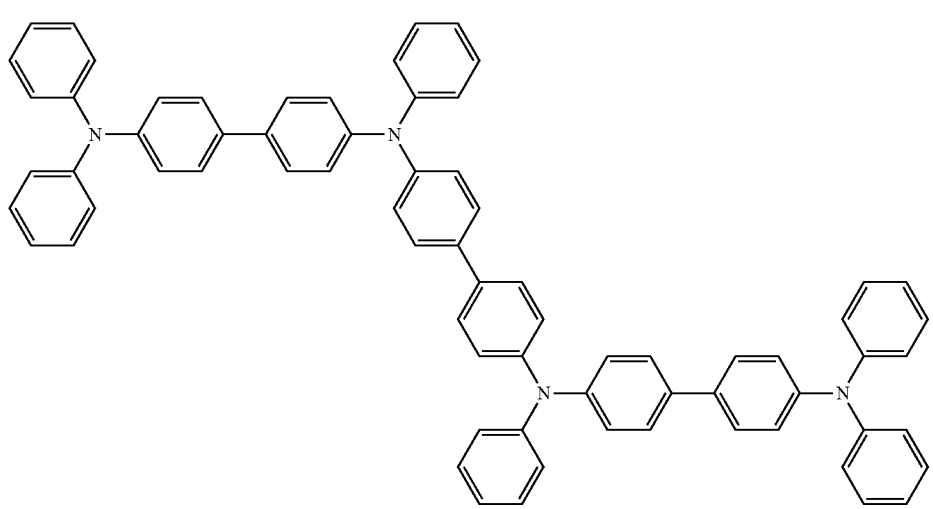

(9)

The average thickness of the hole transport layer 43 is not particularly limited but is preferably about 1 nm or more and 50 nm or less and more preferably about 5 nm or more and 30 nm or less. With the hole transport layer 43 having an average thickness in this range, the carrier injection operation of the carrier selection layer 46 is accurately performed in the light-emitting element 1R.

[Blue Light-Emitting Function Layer 5B]

The blue light-emitting function layer 5B is composed of a blue light-emitting material which emits blue light.

In this embodiment, the blue light-emitting function layer 5B constitutes the first layer provided between the anodes (3R, 3G, 3B) and the cathode 8 and has the function of emitting light of the first color (blue).

The constituent material of the blue light-emitting function layer 5B is not particularly limited, but a material, which permits the blue light-emitting function layer 5B to be formed using a vapor-phase process in the step of forming the blue light-emitting function layer 5B described below, is preferably used. Examples of such a material include blue light-emitting materials such as a styryl derivative represented by formula (10) below.

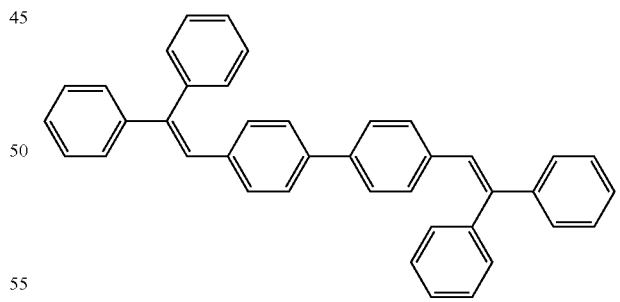

(10)

Besides these materials, a material including a host material doped with a blue light-emitting material as a guest material is used as the constituent material of the blue light-emitting function layer 5B. The host material has the function of producing excitons by recombination of holes and electrons and transferring the energy of the excitons to the blue light-emitting material (Forster transfer or Dexter transfer). The blue light-emitting material serving as the guest material is efficiently excited by the function of the host material, emitting light.

Examples of the host material include anthracene derivatives represented by formulae (11), (12), and (13) below. These derivates can be used alone or in combination of two or more. Examples of the blue light-emitting material used as the guest material include styryl derivatives represented by formulae (14), (15), and (16) below. These derivates can be used alone or in combination of two or more.

(11)
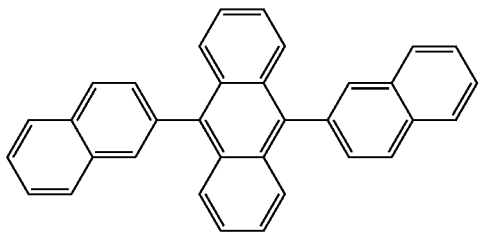

(12)
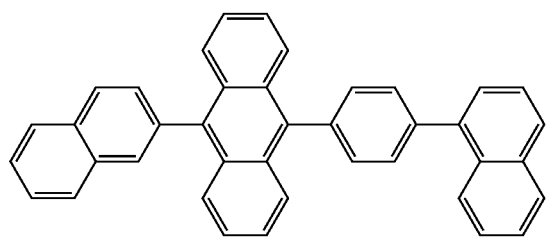

(13)
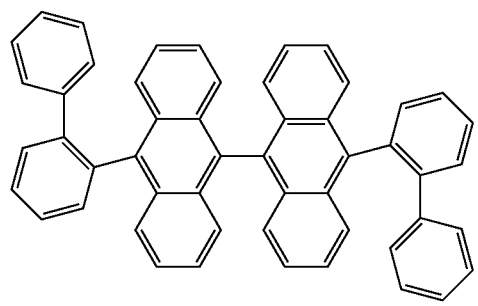

(14)
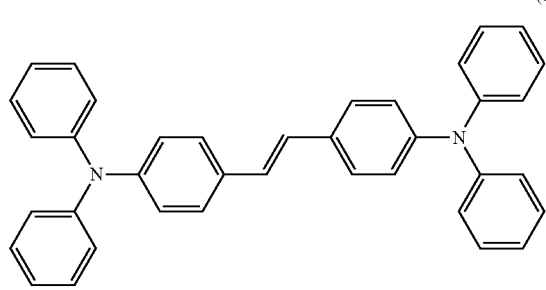

(15)
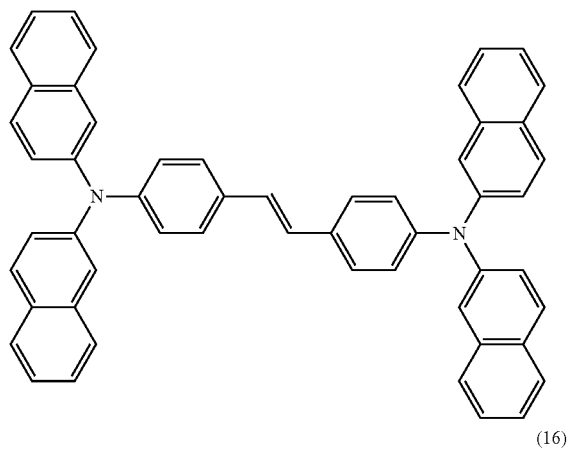

(16)
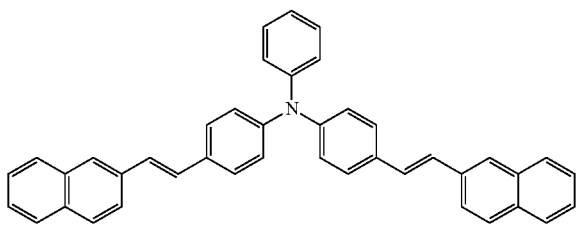

The light-emitting element 1B including the blue light-emitting function layer 5B formed by the vapor-phase process sufficiently has a practical level of emission life characteristic.

Further, when such a guest material and host material are used, the content (doping amount) of the guest material in the blue light-emitting function layer 5B is preferably about 0.1% or more and 20% or less, more preferably about 0.5% or more and 10% or less, in terms of a weight ratio to the host material. With the guest material at a content within this range, the luminous efficiency can be optimized.

The average thickness of the blue light-emitting function layer 5B is not particularly limited but is preferably about 5 nm or more and 100 nm or less and more preferably about 10 nm or more and 50 nm or less.

[Electron Transport Layer 62]

The electron transport layer 62 has the function of transporting, to the blue light-emitting function layer 5B, the electrons injected to the electron transport layer 62 from the cathode 8 through the second electron injection layer 63. In addition, the electron transport layer 62 may have the function of blocking holes which try to pass through the electron transport layer 62 from the blue light-emitting function layer 5B.

The constituent material (electron-transporting material) of the electron transport layer 62 is not particularly limited, but a material, which permits the electron transport layer 62 to be formed using a vapor-phase process in the step of forming the electron transport layer 62 described below, is preferably used. Examples of such a material include quinoline derivatives such as organic metal complexes, e.g., tris(8-quinolinolato) aluminum ($Alq_3$), 8-quinolinolato lithium (Liq), and the like, which include 8-quinolinol or derivatives thereof as ligands; oxadiazole derivatives such as 2-(4-tert-butylphenyl)-5-(4-biphenyl)-1,3,4-oxadiazole (tBu-PBD) and 2,5-bis (1-naphthyl)-1,3,4-oxadiazole (END); triazole derivatives such as 3-(4-biphenyl)-4-phenyl-5-(4-tert-butylphenyl)-1,2, 4-triazole (TAZ); silole derivatives such as a compound represented by formula (17) below; pyridine derivatives; pyrimidine derivatives; quinoxaline derivatives; nitrogen-containing heterocyclic derivatives such as a compound represented by formula (18) below; and the like. These can be used alone or in combination of two or more.

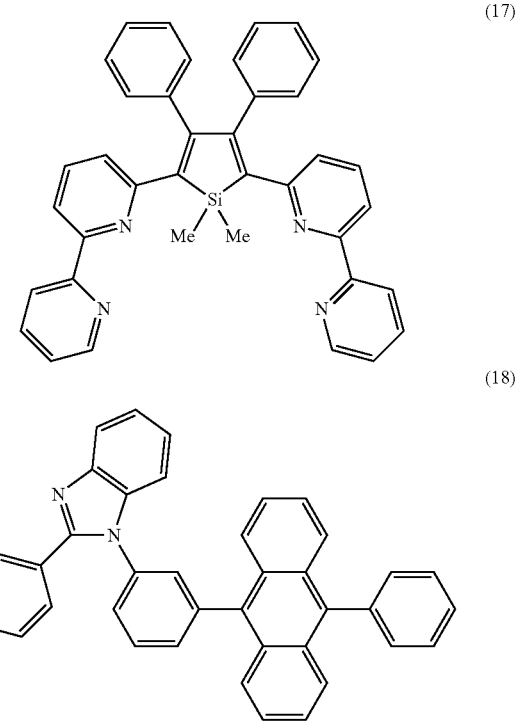

(17)

(18)

The average thickness of the electron transport layer 62 is not particularly limited but is preferably about 1 nm or more and 100 nm or less and more preferably about 5 nm or more and 50 nm or less. In this case, electrons injected from the second electron injection layer 63 can be preferably transported to the blue light-emitting function layer 5B.

The electron transport layer 62 may be omitted according to combinations of the types of the constituent materials and the thicknesses of the red light-emitting function layer 5R, the first electron injection layer 61, the hole transport layer 43, the blue light-emitting function layer 5B, the second electron injection layer 63, and the cathode 8 which constitute the light-emitting element 1R.

[Second Electron Injection Layer 63]

The second electron injection layer 63 has the function of improving the efficiency of electron injection to the electron transport layer 62 from the cathode 8.

The constituent material (electron-injecting material) of the second electron injection layer 63 is not particularly limited but, for example, the same constituent materials as those for the above-described first electron injection layer 61 can be used.

The constituent material (electron-injecting material) of each of the second electron injection layer 63 and the first electron injection layer 61 is selected so that an optimum injection efficiency can be achieved according to combination of the constituent materials of two layers which hold the electron injection layer therebetween. Therefore, the constituent materials of the second electron injection layer 63 and the first electron injection layer 61 may be the same or different from each other.

The average thickness of the second electron injection layer 63 is not particularly limited but is preferably about 0.01 nm or more and 100 nm or less and more preferably about 0.1 nm or more and 10 nm or less.

The second electron injection layer 63 may be omitted according to combinations of the types of the constituent materials and the thicknesses of the electron transport layer 62 and the cathode 8.

[Cathode 8]

The cathode 8 is an electrode which injects electrons to the electron transport layer 62 through the second electron injection layer 63.

As the constituent material of the cathode 8, a material having small work function is preferably used. As the constituent material of the cathode 8, for example, Li, Mg, Ca, Sr, La, Ce, Er, Eu, Sc, Y, Yb, Ag, Cu, Al, Cs, Rb, and Au or alloys including these elements are used so that the cathode 8 can be formed by the vapor-phase process in the step of forming the cathode 8 described below. These materials can be used alone or in combination (e.g., a laminate of a plurality of layers) of two or more.

In particular, as in the embodiment, in the display device 100 having the bottom-emission structure, the cathode 8 is not required to be light-transmissive, and, for example, a metal or an alloy, such as Al, Ag, AlAg, AlNd, or the like, is preferably used as the constituent material of the cathode 8. When such a metal or alloy is used as the constituent material of the cathode 8, the electron injection efficiency and stability of the cathode 8 can be improved.

The average thickness of the cathode 8 is not particularly limited but is preferably about 50 nm or more and 1000 nm or less and more preferably about 100 nm or more and 500 nm or less.

When the display device 100 has a top-emission structure, a metal or alloy, such as MgAg, MgAl, MgAu, AlAg, or the like, is preferably used as the constituent material of the cathode 8. By using such a metal or alloy as the constituent material of the cathode 8, the electron injection efficiency and stability of the cathode 8 can be improved while the light transmissivity of the cathode is maintained.

In this case, the average thickness of the cathode 8 is not particularly limited but is preferably about 1 nm or more and 50 nm or less and more preferably about 5 nm or more and 20 nm or less.

In the light-emitting element 1R configured as described above, any desired layer may be provided between any two of the anode 3R, the hole injection layer 41R, the intermediate layer 42R, the red light-emitting function layer 5R, the first electron injection layer 61, the hole transport layer 43, the blue light-emitting function layer 5B, the electron transport layer 62, the second electron injection layer 63, and the cathode 8.

(Light-Emitting Element 1G)

The light-emitting element (green light-emitting element) 1G includes a laminate of the hole injection layer 41G, the intermediate layer 42G, the green light-emitting function layer 5G, the carrier selection layer 46, the blue light-emitting function layer 5B, the electron transport layer 62, and the second electron injection layer 63, which are laminated in that order from the anode 3G side between the anode 3G and the cathode 8.

In the light-emitting element 1G, the carrier selection layer 46 includes a laminate of the first electron injection layer 61 and the hole transport layer 43 which are laminated in that order from the anode 3G side. In addition, in the light-emitting element 1G, the anode 3G and the cathode 8 form the individual electrode and the common electrode, respectively.

The anode 3G functions as an electrode which injects holes to the hole injection layer 41G, and the cathode 8 functions as an electrode which injects electrons to the electron transport layer 62 through the second electron injection layer 63.

The light-emitting element 1G is described below, but differences from the above-described light-emitting element 1R are mainly described, and description of the same matters is omitted.

The configuration of the light-emitting element 1G is the same as the light-emitting element 1R except that the green light-emitting function layer 5G is provided in place of the red light-emitting function layer 5R.

[Green Light-Emitting Function Layer 5G]

The green light-emitting function layer 5G is composed of a green light-emitting material which emits green light.

In the light-emitting element 1G, the green light-emitting function layer 5G constitutes the third layer provided between the anode 3G and the carrier selection layer (second layer) 46, and has the function of emitting light of the second color (green) in the light-emitting element 1G.

The constituent material of the green light-emitting function layer 5G is not particularly limited, but a material which can be dissolved or dispersed in a solution is preferably used so that the green light-emitting function layer 5G can be formed by the liquid-phase process in the step of forming the green light-emitting function layer 5G described below. Therefore, as the constituent material of the green light-emitting function layer 5G, a green light-emitting polymer material and green light-emitting low-molecular-weight material are preferably used because they can be dissolved or dispersed in a solvent or a dispersion medium. Examples thereof include green light-emitting polymer materials represented by general formulae (19) and (20) below.

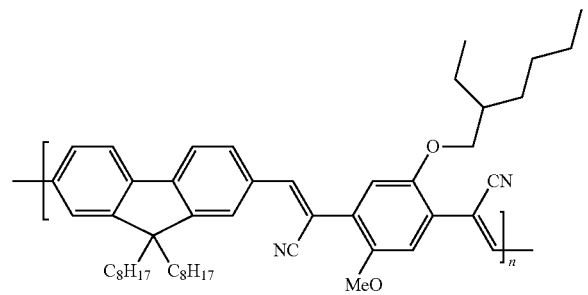

(19)

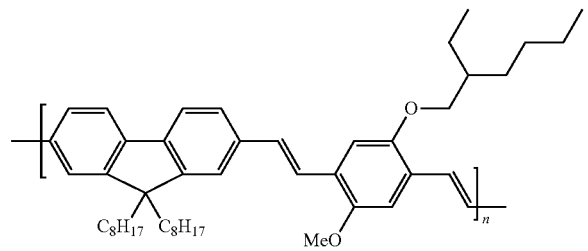

(20)

The light-emitting element 1G including the green light-emitting function layer 5G formed through the liquid-phase process sufficiently has a practical level of emission life characteristic.

The average thickness of the green light-emitting function layer 5G is not particularly limited but is preferably about 10 nm or more and 150 nm or less and more preferably about 20 nm or more and 100 nm or less.

In the light-emitting element 1G configured as described above, any desired layer may be provided between the adjacent layers of the anode 3G, the hole injection layer 41G, the intermediate layer 42G, the green light-emitting function layer 5G, the first electron injection layer 61, the hole transport layer 43, the blue light-emitting function layer 5B, the electron transport layer 62, the second electron injection layer 63, and the cathode 8.

(Light-Emitting Element 1B)

The light-emitting element (blue light-emitting element) 1B includes a laminate of the hole injection layer 41B, the carrier selection layer 46, the blue light-emitting function layer 5B, the electron transport layer 62, and the second electron injection layer 63, which are laminated in that order from the anode 3B side between the anode 3B and the cathode 8.

In the light-emitting element 1B, the carrier selection layer 46 includes a laminate of the first electron injection layer 61 and the hole transport layer 43 which are laminated in that order from the anode 3B side. In addition, in the light-emitting element 1B, the anode 3B and the cathode 8 form the individual electrode and the common electrode, respectively. The anode 3B functions as an electrode which injects holes to the hole injection layer 41B, and the cathode 8 functions as an electrode which injects electrons to the electron transport layer 62 through the second electron injection layer 63.

The light-emitting element 1B is described below, but differences from the above-described light-emitting element 1R are mainly described, and description of the same matters is omitted.

The configuration of the light-emitting element 1B is the same as the light-emitting element 1R except that the formation of the intermediate layer 42R and the red light-emitting function layer 5R is omitted, and the hole injection layer 41B and the carrier selection layer 46 are formed in contact with each other. Since the hole injection layer 41B and the carrier selection layer 46 are formed in contact with each other, the function of the carrier selection layer 46 in the light-emitting element 1B is greatly different from the function of the carrier selection layer 46 in the light-emitting elements 1R and 1G. In addition, the function required for the hole injection layer 41B may be different.

[Hole Injection Layer 41B]

The hole injection layer 41B has the function of facilitating hole injection from the anode 3B.

The constituent material (hole injecting material) of the hole injection layer 41B is not particularly limited, but an ion-conducting hole-injecting material including a conductive polymer material (or a conductive oligomer material) doped with an electron-accepting dopant is preferably used so that the hole injection layer 41B can be formed by the liquid-phase process in the step of forming the hole injection layer 41B described below.

As the constituent material (hole-injecting material) of the hole injection layer 41B, a material to which the electron-injecting material of the first electron injection layer 61 easily diffuses or adsorbs is preferably selected. In this case, the carrier blocking operation of the carrier election layer 46 in the light-emitting element 1B is accurately performed. As the material to which the electron-injecting material constituting the first electron injection layer 61 easily diffuses or adsorbs, for example, an ion-conducting hole-injecting material can be used.

As such an ion-conducting hole-injecting material, the same as the constituent materials (hole-injecting materials) of the hole injection layer 41R can be used.

[Carrier Selection Layer 46]

The carrier selection layer (second layer) 46 includes a laminate of the first electron injection layer 61 and the hole transport layer 43 which are laminated in that order from the anode 3B side. As the constituent materials of the first electron injection layer 61 and the hole transport layer 43, the same materials as those of the above-described light-emitting element 1R can be used.

In the light-emitting element 1B, the carrier selection layer 46 performs the carrier blocking operation of blocking the electrons flowing into the carrier selection layer 46 from the blue light-emitting function layer 5B and holding the electrons in the blue light-emitting function layer 5B. Therefore, in the light-emitting element 1B, light is efficiently emitted from the blue light-emitting function layer 5B. In order to accurately perform the carrier blocking operation, the hole transport layer 43 in the light-emitting element 1B preferably has the carrier blocking function. For example, when the amine compound described above as the constituent material of the hole transport layer 43 in the light-emitting element 1R is used, the hole transport layer 43 has the electron blocking function.

In the light-emitting element 1B configured as described above, any desired layer may be provided between the adjacent layers of the anode 3B, the hole injection layer 41B, the first electron injection layer 61, the hole transport layer 43, the blue light-emitting function layer 5B, the electron transport layer 62, the second electron injection layer 63, and the cathode 8.

With respect to the operations and advantages of the light-emitting elements 1R, 1G, and 1B, the function of the carrier selection layer 46 is mainly described below.

In the embodiment, the carrier selection layer (second layer) 46 includes a laminate of the first electron injection layer 61 and the hole transport layer 43 which are laminated in that order from the anode (3R, 3G, 3B) side.

The carrier selection layer 46 having this configuration is a layer which selectively controls the amount of electrons injected into the carrier selection layer 46 from the blue light-emitting function layer 5B depending on the layer (third layer) in contact with the anode (3R, 3G, 3B) side of the carrier selection layer 46. That is, the carrier selection layer 46 is a layer having the function of selecting a carrier flow depending on the function of the third layer.

Specifically, when the layers in direct contact with the anode (3R, 3G, 3B) side in the carrier selection layer 46 are the red light-emitting function layer 5R and the green light-emitting function layer 5G as in the light-emitting elements 1R and 1G, i.e., when a light-emitting function layer having the function of emitting light of the second color is in contact with the anode-side interface of the carrier selection layer, the carrier selection layer 46 smoothly injects the electrons (carrier injection operation) into the red light-emitting function layer 5R and the green light-emitting function layer 5G, the electrons flowing to the carrier selection layer 46 from the blue light-emitting function layer 5B. Therefore, in the light-emitting element 1R, recombination of holes and electrons in the blue light-emitting function layer 5B is accurately suppressed or prevented, and thus the blue light-emitting function layer 5B does not emit light. If the blue light-emitting function layer 5B emits light, the emission is accurately suppressed. On the other hand, in the red light-emitting function layer 5R, electrons are supplied (injected) from the cathode 8 side through the blue light-emitting function layer 5B and holes are supplied (injected) from the anode 3R side. Therefore, in the red light-emitting function layer 5R, holes and electrons recombine, and excitons are generated by the recombination. When the excitons return to the ground state, energy is emitted as fluorescence or phosphorescence, thereby emitting red light from the red light-emitting function layer 5R. As a result, the light-emitting element 1R emits red light. Similarly, in the light-emitting element 1G, light emission from the blue light-emitting function layer 5B is significantly suppressed, and the green light-emitting function layer 5G selectively or dominantly emits light. As a result, the light-emitting element 1G emits green light.

On the other hand, when a layer in contact with the anode 3B side of the carrier selection layer 46 is the hole injection layer 41B as in the light-emitting element 1B, i.e., when the hole injection layer is in contact with the anode-side interface in the carrier selection layer, the carrier selection layer 46 blocks the electrons flowing to the carrier selection layer 46 from the blue light-emitting function layer 5B and holds the electrons in the blue light-emitting function layer 5B (carrier blocking operation). Therefore, in the blue light-emitting function layer 5B, holes supplied (injected) from the anode 3B side easily recombine with the electrons supplied (injected) from the cathode 8 side. Thus, excitons are generated by the recombination, and when the excitons return to the ground state, energy is emitted as fluorescence or phosphorescence, thereby efficiently emitting light from the blue light-emitting function layer 5B. As a result, the light-emitting element 1B emits blue light with high efficiency.

As described above, the carrier selection layer 46 performs the carrier injecting operation or the carrier blocking operation depending on the type of the third layer in contact with the carrier selection layer (second layer) 46.

The reason why the behavior of the carrier selection layer 46 for electrons in the light-emitting elements 1R and 1G is different from that in the light-emitting element 1B is described with reference to an example in which the hole injection layer 41B is composed of an ion-conducting hole-injecting material.

First, when, in the light-emitting element 1R and the light-emitting element 1G, layers in contact with the anode (3R, 3G) side of the carrier selection layer 46 are the red light-emitting function layer 5R and the green light-emitting function layer 5G, respectively, the electron-injecting material, which constitutes the first electron injection layer 61 of the carrier selection layer 46, diffuses into the hole transport layer 43 in the light-emitting element 1R and the light-emitting element 1G, respectively. Therefore, in the light-emitting element 1R and the light-emitting element 1G, the electron blocking function of the hole transport layer 43 is greatly decreased. As a result, in the light-emitting element 1R and the light-emitting element 1G, electrons are smoothly injected to the hole transport layer 43 from the blue light-emitting function layer 5B. Further, electrons are smoothly injected to the red light-emitting function layer 5R and the green light-emitting function layer 5G from the hole transport layer 43 due to the function of the first electron injection layer 61 present between the hole transport layer 43 and the red light-emitting function layer 5R and the green light-emitting function layer 5G. Consequently, when in the light-emitting element 1R and the light-emitting element 1G, the layers in contact with the anode (3R, 3G) side of the carrier selection layer 46 are the red light-emitting function layer 5R and the green light-emitting function layer 5G, respectively, the carrier selection layer 46 smoothly injects electrons (carrier injecting operation) to the red light-emitting function layer 5R and the green light-emitting function layer 5G, the electrons flowing to the carrier selection layer 46 from the blue light-emitting function layer 5B. That is, the carrier selection layer 46 performs the operation of smoothly flowing electrons (carriers) from the blue light-emitting function layer 5B to the red light-emitting function layer 5R and the green light-emitting function layer 5G.

On the other hand, when, in the light-emitting element 1B, a layer in contact with the anode 3B side of the carrier selection layer 46 is the hole injection layer 41B which is composed of an ion-conducting hole-injecting material, the electron-injecting material which constitutes the first electron injection layer 61 in the carrier selection layer 46 of the light-emitting element 1B greatly diffuses into the hole injection layer 41B or adsorbs on the cathode 8-side interface of the hole injection layer 41B. Therefore, in the light-emitting element 1B, the electron-injecting material which constitutes the first electron injection layer 61 does not diffuse into the hole transport layer 43, and thus the electron blocking function of the hole transport layer 43 in the light-emitting element 1B is not decreased. As a result, in the light-emitting element 1B, electrons flowing into the hole transport layer 43 from the blue light-emitting function layer 5B are blocked by the hole transport layer 43 and are held in the blue light-emitting function layer 5B. Consequently, when the layer in contact with the anode 3B side of the carrier selection layer 46 is the hole injection layer 41B, the carrier selection layer 46 blocks electrons (carrier blocking operation) flowing to the carrier selection layer 46 from the blue light-emitting function layer 5B and holds the electrons in the blue light-emitting function layer 5B. That is, the carrier selection layer 46 performs the operation of suppressing a flow of electrons (carriers) from the blue light-emitting function layer 5B.

As a result of investigation conducted by the inventors, it has been found that in a red light-emitting element (red light-emitting element without a carrier selection layer) having a configuration in which the blue light-emitting function layer 5B and the red light-emitting function layer 5R are laminated in contact with each other, excluding the carrier selection layer 46 in the light-emitting element 1R, when a voltage is applied between the anode 3R and the cathode 8 provided in the red light-emitting element without the carrier selection layer, the electrons injected into the blue light-emitting function layer 5B from the cathode 8 side cannot be smoothly injected (supplied) to the red light-emitting function layer 5R. This causes recombination of holes and electrons in the blue light-emitting function layer 5B, and thus blue light is emitted from the blue light-emitting function layer 5B, thereby degrading the red color purity of the red light-emitting element without the carrier selection layer. Also, it has been found that in the red light-emitting element without the carrier selection layer, the electrons injected into the blue light-emitting function layer 5B from the cathode 8 side cannot be smoothly injected (supplied) to the red light-emitting function layer 5R, thereby causing disruption of a carrier balance between electrons and holes in the red light-emitting function layer 5R and decreasing the luminous efficiency. Further, it has been found that in the red light-emitting element without the carrier selection layer, the electrons injected into the blue light-emitting function layer 5B from the cathode 8 side cannot be smoothly injected (supplied) to the red light-emitting function layer 5R, thereby causing an increase in the energy barrier to carriers at the cathode-side interface of the red light-emitting function layer 5R and an increase in drive voltage.

Therefore, the red light-emitting element without the carrier selection layer has the problems of degrading the red color purity, decreasing the luminous efficiency, and increasing the drive voltage. However, as in the light-emitting element 1R, in a configuration in which the carrier selection layer 46 is interposed between the blue light-emitting function layer 5B and the red light-emitting function layer 5R, the electrons injected into the blue light-emitting function layer 5B from the cathode 8 side can be smoothly injected (supplied) to the red light-emitting function layer 5R without being held in the blue light-emitting function layer 5B, thereby resolving all the problems.

Similarly, in a green light-emitting element (a green light-emitting element without a carrier selection layer) having a configuration in which the blue light-emitting function layer 5B and the green light-emitting function layer 5G are laminated in contact with each other, excluding the carrier selection layer 46, in the light-emitting element 1G, the electrons injected into the blue light-emitting function layer 5B from the cathode 8 side cannot be smoothly injected (supplied) to the green light-emitting function layer 5G, thereby causing the problems of degrading the green color purity, decreasing the luminous efficiency, and increasing the drive voltage. However, as in the light-emitting element 1G, in a configuration in which the carrier selection layer 46 is interposed between the blue light-emitting function layer 5B and the green light-emitting function layer 5G, the electrons injected into the blue light-emitting function layer 5B from the cathode 8 side can be smoothly injected (supplied) to the green light-emitting function layer 5G without being held in the blue light-emitting function layer 5B, thereby resolving all the problems.

In addition, in the embodiment, the hole transport layer 43 and the blue light-emitting function layer 5*b* can be formed by a vapor-phase process. As a result of investigation conducted by the inventors, it has been found that in a blue light-emitting element with a configuration in which at least one of the hole transport layer 43 and the blue light-emitting function layer 5B in the light-emitting element 1B is formed by a liquid-phase process such as an ink jet method, there is the problem of decreasing the emission life and luminous efficiency as compared with the light-emitting element 1B.

A conceivable cause of the problem is contamination of at least one of the hole transport layer 43 and the blue light-emitting function layer 5B. That is, as in the light-emitting element 1B, when the hole transport layer 43 and the blue light-emitting function layer 5B can be formed by a vapor-phase process, the hole transport layer 43 can be continuously deposited on the blue light-emitting function layer 5B without exposure of the cathode-side interface of the hole transport layer 43 to an atmosphere other than a vacuum. However, when at least one of the hole transport layer 43 and the blue light-emitting function layer 5B is formed by a liquid-phase process, deposition by the liquid-phase process is performed in an atmosphere (e.g., air or nitrogen) other than a vacuum because the liquid-phase process is difficult to perform in a vacuum atmosphere, and thus the cathode 8-side interface of at least the hole transport layer 43 is exposed to an atmosphere other than vacuum. Therefore, when at least one of the hole transport layer 43 and the blue light-emitting function layer 5B is formed by a liquid-phase process, the cathode 8-side interface of the hole transport layer 43 is obviously easily contaminated. In addition, when the hole transport layer 43 is deposited by a liquid-phase process, deposition is performed using a solution in which a hole-transporting material is dissolved or dispersed in a solvent or a dispersion medium. Therefore, a trace amount of the solvent remains in the hole transport layer 43, thereby causing the possibility of contamination of the whole hole transport layer 43. Similarly, when the blue light-emitting function layer 5B is deposited by a liquid-phase process, a trace amount of the solvent remains in the blue light-emitting function layer 5B, thereby causing the possibility of contamination of the whole blue light-emitting function layer 5B.

However, as in the light-emitting element 1B, when the hole transport layer 43 and the blue light-emitting function layer 5B can be formed by a vapor-phase process, it is possible to avoid contamination of the hole transport layer 43 and the blue light-emitting function layer 5B which is caused by forming at least one of the hole transport layer 43 and the blue light-emitting function layer 5B by a liquid-phase process. Also, it is possible to resolve all the problems of decreasing the emission life and luminous efficiency of the blue light-emitting element which are caused by forming at least one of the hole transport layer 43 and the blue light-emitting function layer 5B by a liquid-phase process.

In the embodiment, preferably, the hole injection layer 41B is composed of an ion-conducting hole-injecting material as a main material, and the first electron injection layer 61 is composed of an electron-injecting material such as an alkali metal, an alkaline-earth metal, or a compound thereof as a main material. In this case, when in the light-emitting element 1B, the electron-injecting material contained in the first electron injection layer 61 diffuses to the hole transport layer 43 side, the diffusion of the electron-injecting material to the hole transport layer 43 causes the problems of decreasing the electron blocking performance of the hole transport layer 43 and, accordingly, decreasing the luminous efficiency of the blue light-emitting function layer 5B. In addition, diffusion of the electron-injecting material to the blue light-emitting function layer 5B causes the problems of inhibiting light emission of the blue light-emitting function layer 5B and, accordingly, decreasing the luminous efficiency. However, in the embodiment, since in the light-emitting element 1B, the first electron injection layer 61 and the ion-conducting hole injection layer 41B are in contact with each other, the electron-injecting material greatly diffuses into the hole injection layer 41B or adsorbs on the cathode 8-side interface of the hole injection layer 41B. This accurately suppresses or prevents the diffusion of the electron-injecting material to the hole transport layer 43, and thus all the problems due to the diffusion of the electron-injecting material to the hole transport 43 side are resolved.

(Method for Producing Display Device 100)

The above-described display device 100 can be produced, for example, as described below.

[1] First, the substrate 21 is prepared, and a plurality of the driving transistors 24 are formed to correspond to the respective sub-pixels 100R, 100G, and 100B to be formed. Then, the planarization layer 22 is formed to cover the driving transistors 24 (first step).

[1-A] First, the substrate 21 is prepared, and the driving transistors 24 are formed on the substrate 21.

[1-Aa] First, a semiconductor film composed of amorphous silicon as a main material is formed to an average thickness of about 30 nm or more and 70 nm or less by, for example, a plasma CVD method.

[1-Ab] Next, the semiconductor film is crystallized by laser annealing or a solid-phase growth method to convert the amorphous silicon to polysilicon.

In this case, in the laser annealing method, for example, an excimer laser line beam having a long dimension of 400 mm is used, and the output intensity is set to, for example, about 200 mJ/cm$^2$.

[1-Ac] Next, the semiconductor film is patterned in an island-like shape to form the semiconductor layers 241. The gate insulating layer 242 composed of silicon oxide or silicon nitride as a main material is formed to an average thickness of about 60 nm or more and 150 nm or less by a plasma CVD method using, for example, TEOS (tetraethoxysilane) and oxygen gas as raw material gas, so as to cover the island-like semiconductor layer 241.

[1-Ad] Next, a conductive film composed of a metal, such as aluminum, tantalum, molybdenum, titanium, or tungsten, as a main material is formed on the gate insulating layer 242 by, for example, a sputtering method; and then patterned to form the gate electrodes 243.

[1-Ae] Next, in this state, high-concentration phosphorous ions are implanted to form source and drain regions in each of the gate electrodes 243 in a self-aligning manner, In addition, portions not implanted with impurities are channel regions.

[1-B] Next, the source electrode 244 and the drain electrode 245 electrically connected to each of the driving transistors 24 are formed.

[1-Ba] First, a first planarization layer is formed to cover the gate electrodes 243, and then contact holes are formed.

[1-Bb] Next, the source electrode 244 and the drain electrode 245 are formed in each of the contact holes.

[1-C] Next, wiring (relay electrode) 27 which electrically connects the drain electrode 245 to each of the anodes 3R, 3G, and 3B is formed.

[1-Ca] First, a second planarization layer is formed on the first planarization layer, and then contact holes are formed.

[1-Cb] Next, the wiring 27 is formed in each of the contact holes.

The planarization layer 22 includes the first planarization layer and the second planarization layer formed in the steps [1-B] and [1-C], respectively.

[2] Next, the anodes (individual electrodes) 3R, 3G, and 3B are formed on the planarization layer 22 so as to correspond to the respective wirings 27 (second step).

The anodes 3R, 3G, and 3B are formed by forming, on the planarization layer 22, a thin film composed of the constituent material of the anodes 3R, 3G, and 3R as a main material and then patterning the thin film.

[3] Next, the partition wall (bank) 31 is formed on the planarization layer 22 so as to partition the anodes 3R, 3G, and 3B, i.e., partition the regions where the light-emitting elements 1R, 1G, and 1B (sub-pixels 100R, 100G, and 100B) are formed (third step).

The partition wall 31 can be formed by forming an insulating film on the planarization layer 22 so as to cover the anodes 3R, 3G, and 3B and then patterning the insulating film to expose the anodes 3R, 3G, and 3B by photolithography or the like.

In this case, the constituent material of the partition wall 31 is selected in consideration of heat resistance, liquid repellency, ink solvent resistance, adhesion to the planarization layer 22 etc.

Specific examples of the constituent material of the partition wall 31 include organic materials, such as acrylic resins, polyimide resins, epoxy resins, and the like; and inorganic materials, such as $SiO_2$ and the like.

The shape of apertures of the partition wall 31 may be tetragonal or any one of circular, elliptical, and polygonal such as hexagonal.

When the shape of apertures of the partition wall 31 is polygonal, the corners are preferably rounded. In this case, when the hole injection layers 41R, 41G, and 41B, the intermediate layers 42R and 42G, and the light-emitting function layers 5R and 5G are formed using the liquid materials described below, the liquid materials can be securely supplied to every corner of the inner spaces of the partition wall 31.

The height of the partition wall 31 is appropriately determined according to the thickness of the light-emitting elements 1R, 1G, and 1B and not particularly limited, but is preferably about 0.5 μm or more and 5 μm or less. With this height, the function as a partition wall (bank) can be sufficiently exhibited.

When the hole injection layers 41R, 41G, and 41B, the intermediate layers 42R and 42G, and the light-emitting function layers 5R and 5G are formed by an ink jet method, the substrate 21 on which the partition wall 31 has been formed is preferably treated with plasma. Specifically, the surface of the substrate 21 on which the partition wall 31 has been formed is plasma-treated with treatment gas such as $O_2$ gas. As a result, the surfaces of the anodes 3R, 3G, and 3B and the surface (including the wall surfaces) of the partition wall 31 are activated to be made lyophilic. Next, the surface of the substrate 21 is plasma-treated with treatment gas, for example, fluorine-based gas such as $CF_4$. As a result, the fluorine-based gas reacts with only the surface of the partition wall 31 composed of a photosensitive resin, which is an organic material, so that the surface of the partition wall 31 is made liquid-repellent. Consequently, the function of the partition wall 31 is more effectively exhibited.

[4] Next, the hole injection layer 41R, the intermediate layer 42R, and the red light-emitting function layer 5R are formed inside the partition wall 31 within a region where the light-emitting element 1R is to be formed. In addition, the hole injection layer 41G, the intermediate layer 42G, and the green light-emitting function layer 5G are formed inside the partition wall 31 within a region where the light-emitting element 1G is to be formed. Further, the hole injection layer 41B is formed inside the partition wall 31 within a region where the light-emitting element 1B is to be formed (fourth step). The fourth step is described in detail below with respect to each of the light-emitting elements 1R, 1G, and 1B.

[Light-Emitting Element 1R]

The hole injection layer 41R, the intermediate layer 42R, and the red light-emitting function layer 5R are formed in that order inside the partition wall 31 in a region where the light-emitting element 1R is to be formed. The steps of forming the respective layers are described in detail below as the step of forming the hole injection layer 41R, the step of forming the intermediate layer 42R, and the step of forming the red light-emitting function layer 5R.

[Step of Forming the Hole Injection Layer 41R]

First, the hole injection layer 41R is formed by an ink jet method. Specifically, an ink (liquid material) for forming the hole injection layer 41R, which contains a hole-injecting material, is ejected from a head of an ink jet printing apparatus and applied to the cathode 3R (application step).

Examples of a solvent (ink solvent) or a dispersion medium (ink dispersion medium) used for preparing the ink for forming the hole injection layer include inorganic solvents such as nitric acid, sulfuric acid, ammonia, hydrogen peroxide, water, carbon disulfide, carbon tetrachloride, ethylene carbonate, and the like; organic solvents such as ketone solvents, e.g., methyl ethyl ketone (MEK), acetone, diethyl ketone, methyl isobutyl ketone (MIBK), methyl isopropyl ketone, (MIPK), cyclohexanone, and the like, alcohol solvents, e.g., methanol, ethanol, isopropanol, ethylene glycol, diethylene glycol (DEG), glycerin, and the like, ether solvents, e.g., diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), diethylene glycol ethyl ether (carbitol), and the like, cellosolve solvents, e.g., methyl cellosolve, ethyl cellosolve, phenyl cellosolve, and the like, aliphatic hydrocarbon solvents, e.g., hexane, pentane, heptane, cyclohexane, and the like, alicyclic hydrocarbon solvents, e.g., cyclohexane, tetralin, and the like, aromatic hydrocarbon solvents, e.g., toluene, xylene, benzene, trimethylbenzene, tetramethylbenzene, and the like, aromatic heterocyclic compound solvents, e.g., pyridine, pyrazine, furan, pyrrole, thiophene, methylpyrrolidone, and the like, amide solvents, e.g., N,N-dimethylformamide (DMF), N,N-dimethylacetamide (DMA), and the like, halogen compound solvents, e.g., dichloromethane, chloroform, 1,2-dichloroethane, and the like, ester solvents, e.g., ethyl acetate, methyl acetate, ethyl formate, and the like, sulfur compound solvents, e.g., dimethylsulfoxide (DMSO), sulfolane, and the like, nitrile solvents, e.g., acetonitrile, propionitrile, acrylonitrile, and the like, and organic acid solvents, e.g., formic acid, acetic acid, trichloroacetic acid, trifluoroacetic acid, and the like; and mixed solvents thereof.

The liquid material applied to the anode 3R has high mobility (low viscosity) and tends to spread in a horizontal direction (planar direction). However, since the anode 3R is surrounded by the partition wall 31, spread to a region other than the predetermined region is inhibited, and thus the contour shape of the hole injection layer 41R is accurately defined.

Next, the hole injection layer 41R applied is subjected to post-treatment (post-treatment step). Specifically, the ink (liquid material) for forming the hole injection layer applied to the anode 3R is dried to form the hole injection layer 41R. The solvent or the dispersion medium can be removed by the drying. As a drying method, a method of allowing to stand in a reduced-pressure atmosphere, a method of heat treatment (for example, about 40° C. or more and 80° C. or less), or a method of flowing inert gas such as nitrogen gas may be used. Further, if required, the substrate 21 on which the hole injection layer 41R has been formed is heated (baked) at about 100° C. or more and 300° C. or less. By heating, the solvent or dispersion medium remaining in the film of the hole injection layer 41R after drying can be removed. In addition, when a hole-injecting material which is insolubilized in the solvent due to crosslinking by heating is used, the hole injection layer 41R can be insolubilized by the heating. In addition, after heating, the surface of the substrate 21 on which the hole injection layer 41R has been formed may be rinsed with a solvent (washing) in order to remove a noninsolubilized portion of the hole injection layer 41R, The rinsing can prevent the noninsolubilized portion of the hole injection layer 41R from being mixed in the intermediate layer 42R formed on the hole injection layer 41R.

[Step of Forming the Intermediate Layer 42R]

In the step of forming the intermediate layer 42R, first, the intermediate layer 42R is applied to the hole injection layer 41R by the same ink jet method as in the step of forming the hole injection layer 41R. Then, the applied intermediate layer 42R is subjected to the same post-treatment as in the step of forming the hole injection layer 41R. However, an ink solvent or ink dispersion medium used for the ink for forming the intermediate layer 42R, the method and conditions of post-treatment, etc. are appropriately selected to be suitable for forming the intermediate layer 42R.

[Step of Forming the Red Light-Emitting Function Layer 5R]

In the step of forming the red light-emitting function layer 5R, first, the red light-emitting function layer 5R is applied to the intermediate layer 42R by the same ink jet method as in the step of forming the hole injection layer 41R. Then, the applied red light-emitting function layer 5R is subjected to the same post-treatment as in the step of forming the hole injection layer 41R. However, an ink solvent or ink dispersion medium used for the ink for forming the red light-emitting function layer 5R, the method and conditions of post-treatment, etc. are appropriately selected to be suitable for forming the red light-emitting function layer 5R.

The ink jet method is preferably used in the above-described step of forming the hole injection layer 41R, step of forming the intermediate layer 42R, and step of forming the red light-emitting function layer 5R. The ink jet method is capable of precisely controlling the amount of the ink ejected and the landing position of the ink regardless of the area size of the substrate. Therefore, by using the ink jet method, it is possible to thin the hole injection layer 41R, miniaturize the pixel size, and increase the area of the display device 100. In addition, the ink (liquid material) for forming each of the layers can be selectively supplied inside the partition wall, and thus the ink can be efficiently used. However, the method used in the step of forming the hole injection layer 41R, the step of forming the intermediate layer 42R, and the step of forming the red light-emitting function layer 5R is not limited to the ink jet method. Examples of the method include vapor-phase processes such as a sputtering method, a vacuum deposition method, a CVD method, and the like, and liquid-phase processes such as a spin coating method (pyrosol method), a casting method, a micro gravure coating method, a gravure coating method, a bar coating method, a roll coating method, a wire bar coating method, a dip coating method, a spray coating method, a screen printing method, a flexographic printing method, an offset printing method, and the like.

[Light-Emitting Element 1G]

The hole injection layer 41G, the intermediate layer 42G, and the green light-emitting function layer 5G are formed by the same method as for the light-emitting element 1R in that order inside the partition wall 31 within the region where the light-emitting element 1G is to be formed. However, an ink solvent or ink dispersion medium used for the ink for forming each of the hole injection layer 41G, the intermediate layer 42G, and the green light-emitting function layer 5G, the method and conditions of post-treatment, etc. are appropriately selected to be suitable for forming each of the layers,

[Light-Emitting Element 1B]

The hole injection layer 41B is formed by the same method as in the step of forming the hole injection layer 41R of the light-emitting element 1R inside the partition wall within the region where the light-emitting element 1B is to be formed. However, an ink solvent or ink dispersion medium used for the ink for forming the hole injection layer 41B, the method and conditions of post-treatment, etc. are appropriately selected to be suitable for forming the hole injection layer 41B.

As described above, when each of the hole injection layers 41R, 41G, and 41B, the intermediate layers 42R and 42G, and the light-emitting function layers 5R and 5G is formed by the ink jet method, each of the layers is completely formed through the application step and the post-treatment step. However, the application step of each of the layers may be performed at the same time as the application steps of the other layers, and the post-treatment step of each of the layers may be performed at the same time as the post-treatment steps of the other layers.

[5] Next, the first electron injection layer 61 is formed to overlap the red light-emitting function layer 5R, the green light-emitting function layer 5G, the hole injection layer 41B, and the partition wall 31, i.e., to cover the entire surface of the partition wall 31 on the side opposite to the side in contact with the planarization layer 22 (fifth step).

As a result, the first electron injection layer 61 common to the light-emitting elements 1R, 1G, and 1B is collectively (integrally) formed.

The first electron injection layer 61 can also be formed by the vapor-phase process or liquid-phase process described in the above-described step [Light-emitting element 1R], but, in particular, the vapor-phase process is preferably used. By using the vapor-phase process, it is possible to securely form the first electron injection layer 61 while preventing dissolution between the first electron injection layer 61 and each of the red light-emitting function layer 5R, the green light-emitting function layer 5G, and the hole injection layer 41B.

[6] Next, the hole transport layer 43 is formed to cover the entire surface of the first electron injection layer 61 (sixth step). As a result, the hole transport layer 43 common to the light-emitting elements 1R, 1G, and 1B is collectively formed.

[7] Next, the blue light-emitting function layer 5B is formed to cover the entire surface of the hole transport layer 43 (seventh step). As a result, the blue light-emitting function layer 5B common to the light-emitting elements 1R, 1G, and 1B is collectively formed.

[8] Next, the electron transport layer 62 is formed to cover the entire surface of the blue light-emitting function layer 5B (eighth step). As a result, the electron transport layer 62 common to the light-emitting elements 1R, 1G, and 1B is collectively formed.

[9] Next, the second electron injection layer 63 is formed to cover the entire surface of the electron transport layer 62 (ninth step). As a result, the second electron injection layer 63 common to the light-emitting elements 1R, 1G, and 1B is collectively formed.

[10] Next, the cathode 8 is formed to cover the entire surface of the second electron injection layer 63 (tenth step). As a result, the cathode 8 common to the light-emitting elements 1R, 1G, and 1B is collectively formed.

In addition, each of the layers formed in the steps [6] to [10] can also be formed by the vapor-phase process or liquid-phase process described in the step above described in [Light-emitting element 1R], but, in particular, the vapor-phase process is preferably used. By using the vapor-phase process, it is possible to securely form each of the layers to be formed while preventing dissolution between the adjacent layers.

In addition, in the steps described in [Light-emitting element 1R] and [Light-emitting element 1G], the light-emitting function layers 5R and 5G are formed using the liquid-phase process such as the ink jet method, and thus the light-emitting function layers 5R and 5G of different luminescent colors can be easily separately formed, and the display device 100 of a larger area can be easily realized. In addition, in the steps [6] and [7], the hole transport layer 43 and the blue light-emitting function layer 5B are formed using the vapor-phase process (vapor-phase deposition method), and thus the light-emitting element 1B sufficiently has a practical level of emission life. Further, the blue light-emitting function layer 5B common to the light-emitting elements 1R, 1G, and 1B is collectively (integrally) formed, and thus the blue light-emitting function layer 5B need not be selectively formed for the light-emitting element 1B using a high-definition mask. Therefore, it is possible to simplify the process and easily realize the larger-area display device 100.

In addition, in each of the steps [5] and [6], each of the first electron transport layer 61 and the hole transport layer 43 common to the light-emitting elements 1R, 1G, and 1B is integrally formed. That is, the carrier transport layer 46 including the first electron injection layer 61 and the hole transport layer 43 is integrally formed. Therefore, the first electron transport layer 61 and the hole transport layer 43 need not be selectively formed for the light-emitting element 1B using a high-definition mask, thereby simplifying the process and easily realizing the larger-area display device 100.

As described above, the light-emitting elements 1R, 1G, and 1B which emit lights of red, green, and blue, respectively, are formed to correspond to the respective driving transistors 24.

[11] Next, the sealing substrate 20 is prepared, and an epoxy adhesive is interposed between the cathode 8 and the sealing substrate 20 and is then dried.

Consequently, the cathode 8 and the sealing substrate 20 can be bonded together through the epoxy layer 35 so that the cathode 8 is covered with the sealing substrate 20.

The sealing substrate 20 exhibits the function as a protective substrate which protects the light-emitting elements 1R, 1G, and 1B. In this configuration in which the sealing substrate 20 is provided on the cathode 8, contact of oxygen and moisture with the light-emitting elements 1R, 1G, and 1B can be more preferably prevented or decreased, and thus improvement in reliability of the light-emitting elements 1R, 1G, and 1B and the effect of preventing degradation and deterioration can be more securely achieved.

The display device (display device according to the embodiment of the present invention) 100 including the light-emitting elements 1R, 1G, and 1B which are sealed with the sealing substrate 20 is completed through the above-described steps.

The display device (display device according to the embodiment of the present invention) 100 can be incorporated into various electronic apparatuses.

Figure 2:
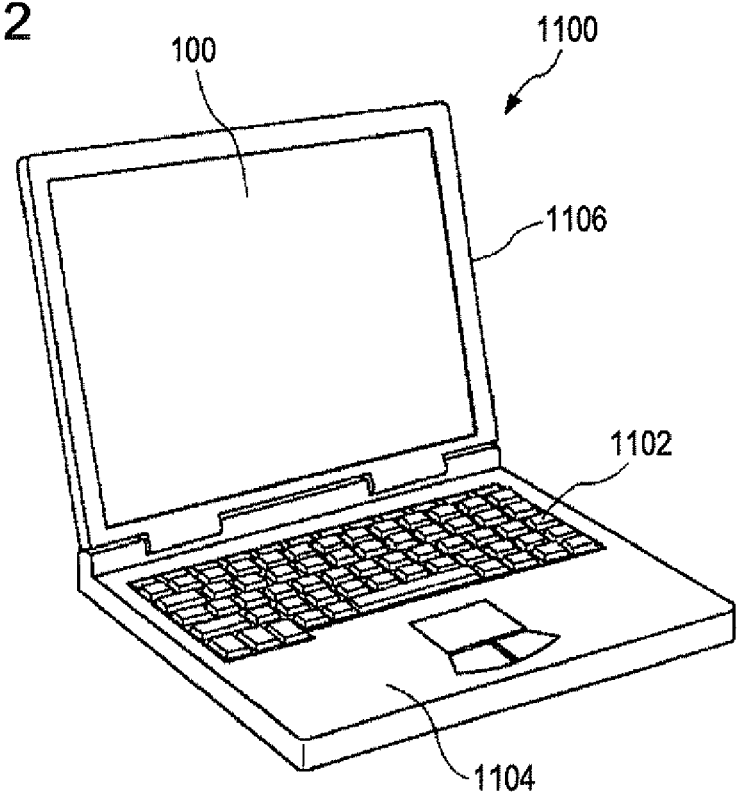
FIG. 2 is a perspective view showing a configuration of a mobile (or notebook-size) personal computer including an electronic apparatus according to an embodiment of the present invention.

FIG. 2 is a perspective view showing a configuration of a mobile type (or a notebook-size) personal computer to which an electronic apparatus according to an embodiment of the present invention is applied.

In this figure, a personal computer 1100 includes a body portion 1104 provided with a keyboard 1102, and a display unit 1106 provided with a display portion. The display unit 1106 is rotatably supported on the body portion 1104 through a hinge structure.

In the personal computer 1100, the display portion provided in the display unit 1106 includes the above-described display device 100.

Figure 3:
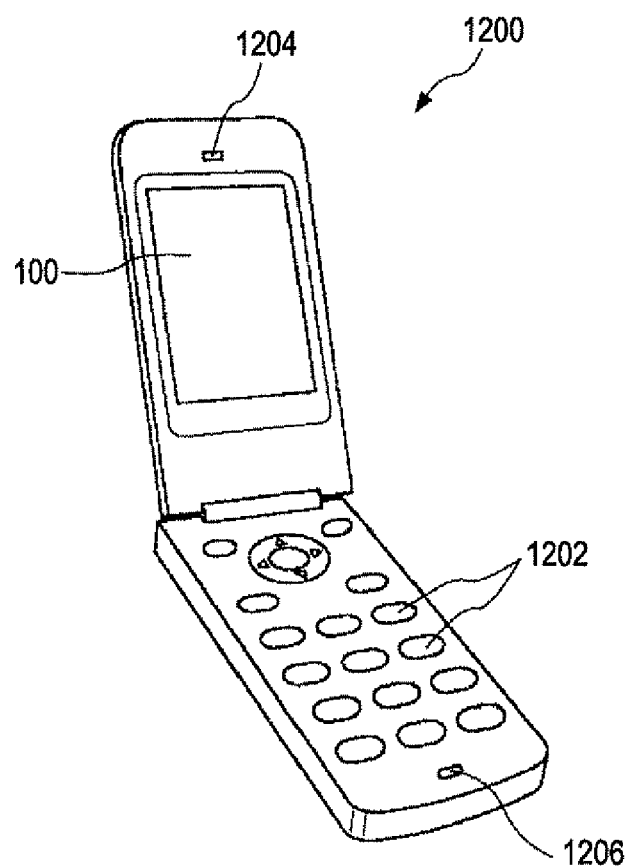
FIG. 3 is a perspective view showing a configuration of a cellular phone (including PHS) including an electronic apparatus according to an embodiment of the present invention.

FIG. 3 is a perspective view showing a configuration of a cellular phone (including PHS) to which an electronic apparatus according to an embodiment of the present invention is applied.

In this figure, a cellular phone 1200 includes a plurality of operating buttons 1202, a ear piece 1204, a mouthpiece 1206, and a display portion.

In the cellular phone 1200, the display portion includes the above-described display device 100.

Figure 4:
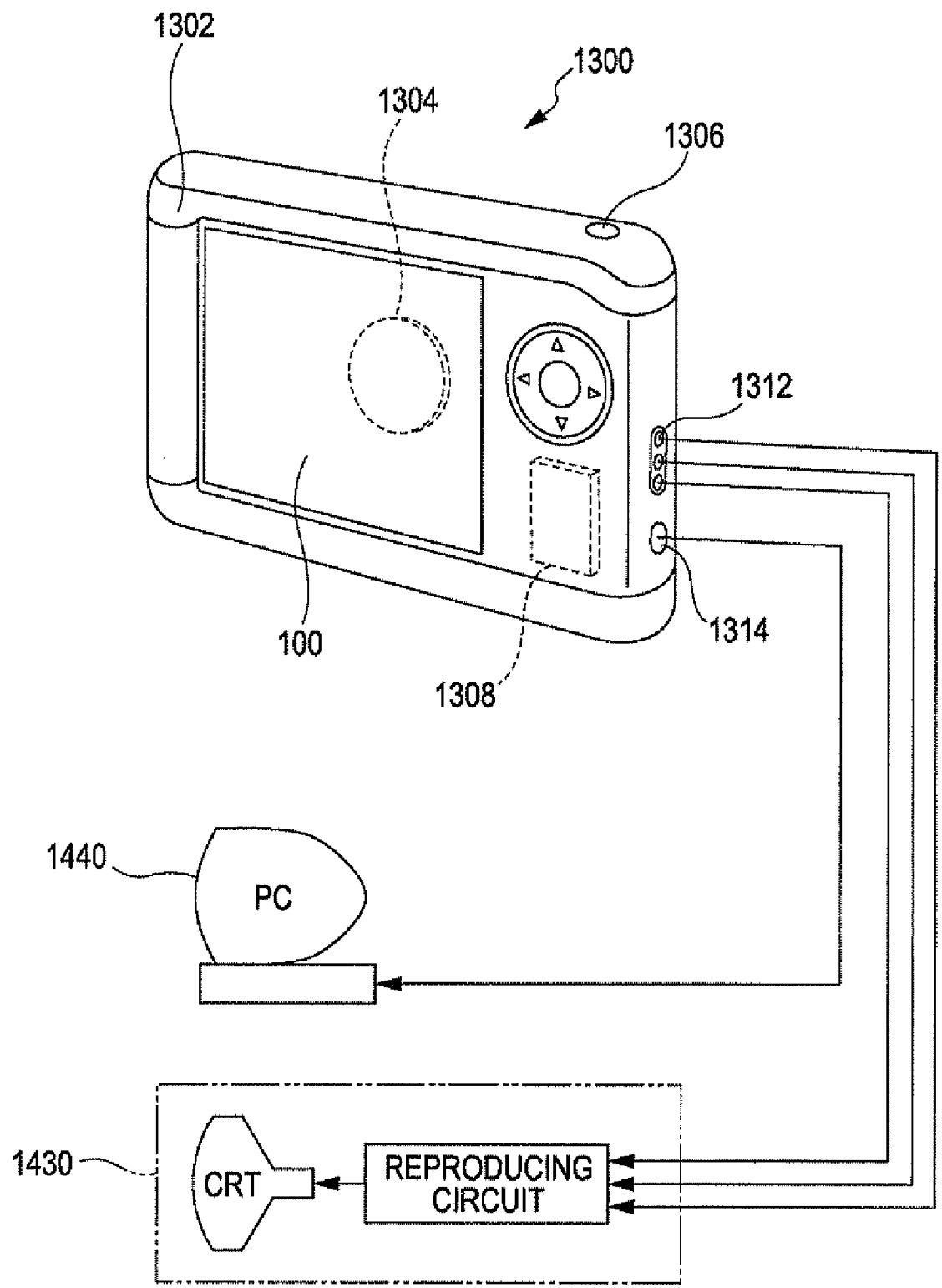
FIG. 4 is a perspective view showing a configuration of a digital still camera including an electronic apparatus according to an embodiment of the present invention.

FIG. 4 is a perspective view showing a configuration of a digital still camera to which an electronic apparatus according to an embodiment of the present invention is applied. Also, this figure simply shows connection to an external apparatus.

In a usual camera, a silver salt photographic film is sensitized by a light image of an object, while in a digital still camera 1300, a light image of an object is photoelectrically converted by an image pickup device such as CCD (Charged Coupled Device) to form an image pickup signal (image signal).

In the digital still camera 1300, a display portion is provided at the back of a case (body) 1302 so as to perform display on the basis of the image pickup signal of CCD and to function as a finder which displays the object as an electronic image.

In the digital still camera 1300, the display portion includes the above-described display device 100.

A circuit board 1308 is provided in the case. The circuit board 1308 is provided with a memory capable of storing image pickup signals.

In addition, a light-receiving unit 1304 including an optical lens (imaging optical system), CCD, etc. is provided on the front side (the rear side of the drawing) of the case 1302.

When a photographer confirms an object image displayed on the display portion and holds down a shutter button 1306, the image pickup signal of CCD at the time is transferred and stored in the memory of the circuit board 1308.

In addition, in the digital still camera 1300, a video signal output terminal 1312 and a data communication input/output terminal 1314 are provided on the side surface of the case 1302. As shown in the drawing, according to demand, a television monitor 1430 is connected to the video signal output terminal 1312, and a personal computer 1440 is connected to the data communication input/output terminal 1314. Further, the image pickup signal stored in the memory of the circuit board 1308 is output to the television monitor 1430 or the personal computer 1440 by a predetermined operation.

Besides the personal computer (mobile-type personal computer) shown in FIG. 2, the cellular phone shown in FIG. 3, and the digital still camera shown in FIG. 4, an electronic apparatus according to an embodiment the present invention can be applied to, for example, a television, a video camera, a view-finder-type or monitor direct-view-type video tape recorder, a laptop personal computer, a car navigation system, a pager, an electronic notebook (including one with a communication function), an electronic dictionary, an electronic calculator, an electronic game device, a word processor, a work station, a picture phone, a security television monitor, an electronic binocular, a POS terminal, devices with a touch panel (e.g., a bank cash dispenser and an automatic ticket machine), medical devices (e.g., an electronic clinical thermometer, a blood-pressure meter, a blood-sugar meter, an electrocardiographic display device, an ultrasonic diagnostic equipment, and an endoscopic display device), a fish detector, various measuring devices, meters (e.g., meters of a vehicle, aircraft, and ship), a flight simulator, other various monitors, and projection-type display devices such as a projector.

Although the display device and the electronic apparatus according to the present invention are described above on the basis of the embodiments shown in the drawings, the present invention is not limited to these.

For example, in the above-described embodiment, the display device includes the red light-emitting element and the green light-emitting element provided as light-emitting elements which emit lights at longer wavelengths than blue light. However, the present invention is not limited to this, and light-emitting elements, such as a yellow light-emitting element and an orange light-emitting element, which emit lights at wavelengths longer than blue light, may be provided.

EXAMPLES

The present invention is described below with reference to examples.

Examples and comparative examples relate to a large-area display device in which a red light-emitting element and a green light-emitting element are formed by a ink jet method, and a blue light-emitting element is formed by a vacuum deposition method without the need for separate depositions for different colors using a high-definition mask. Example 1 relates to results of practical application of the embodiment of the present invention. Comparative Example 1 relates to the conceivable most common structure in the case where a red light-emitting element and a green light-emitting element are formed by a ink jet method, and a blue light-emitting element is formed by a vacuum deposition method without the need for separate depositions for different colors using a high-definition mask. Comparative Example 2 relates to a structure aimed at improving the characteristics of the red light-emitting element and the green light-emitting element which exhibit poor characteristics in Comparative Example 1. In addition, Comparative Example 3 relates to a structure aimed at improving the characteristics of the blue light-emitting element which exhibits poor characteristics in Comparative Example 1.

1. Production of Display Device (Light-Emitting Device) and Light-Emitting Element Example 1

<1> First, a transparent glass substrate having an average thickness of 1.0 mm was prepared as a substrate 321. Next, an ITO film having an average thickness of 50 nm was formed on the substrate 321 by a sputtering method, and then the ITO film was patterned by photolithography to form ITO electrodes (anodes 303R, 303G, and 303B/individual electrodes).

Then, the substrate 321 on which the anodes 303R, 303G, and 303B were formed was dipped, in turn, in acetone and 2-propanol, ultrasonically washed, and then treated with oxygen plasma.

<2> Next, an insulating layer composed of an acrylic resin was formed, by a spin coating method, on the substrate 321 on which the anodes 303R, 303G, and 303B were formed. Then, the insulating layer was patterned by photolithography so that the ITO electrodes were exposed, thereby forming a partition wall (bank). Further, the surface of the substrate 321 on which the partition wall was formed was plasma-treated with $O_2$ gas used as treatment gas. As a result, the surfaces of the anodes 303R, 303G, and 303B and the surface (including the wall surfaces) of the partition wall were made lyophilic by activation. Then, the surface of the substrate 321 on which the partition wall was formed was plasma-treated with $CF_4$ gas used as treatment gas. As a result, only the surface of the partition wall composed of an acrylic resin was made liquid-repellent by reaction with the $CF_4$ gas.

<3A> Next, a 1.0 wt % PEDOT/PSS aqueous dispersion solution was applied, by the ink jet method, inside the partition wall in a region where a red light-emitting element 301R was to be formed.

<3B> Next, a 1.0 wt % PEDOT/PSS aqueous dispersion solution was applied, by the ink jet method, inside the partition wall in a region where a green light-emitting element 301G was to be formed.

<3C> Next, a 1.0 wt % PEDOT/PSS aqueous dispersion solution was applied, by the ink jet method, inside the partition wall in a region where a blue light-emitting element 301B was to be formed.

<3D> Next, the PEDOT/PSS aqueous dispersion solution applied in each of the steps 3A, 3B, and 3C was dried and then the substrate 321 was heated in air to form ion-conducting hole-injection layers 341R, 341G, and 341B on the anodes 303R, 303G, and 303B, respectively, the ion-conducting hole-injection layers 341R, 341G, and 341B being composed of PEDOT/PSS and having an average thickness of 50 nm.

<4A> Next, a 1.5 wt % tetramethylbenzene solution of a compound represented by the general formula (5) was applied, by the ink jet method, inside the partition wall in the region where the red light-emitting element 301R was to be formed.

<4B> Next, a 1.5 wt % tetramethylbenzene solution of a compound represented by the general formula (5) was applied, by the ink jet method, inside the partition wall in the region where the green light-emitting element 301G was to be formed.

<4C> Next, the tetramethylbenzene solution of the compound represented by the general formula (5) applied in each of the steps 4A and 4B was dried and then the substrate 321 was heated in a nitrogen atmosphere. Further, the substrate 321 was rinsed with xylene in the region where the red light-emitting element 301R was to be formed and the region where the green light-emitting element 301G was to be formed. As a result, intermediate layers 342R and 342G were formed on the hole injection layers 341R and 341G, respectively, the intermediate layers 342R and 342G being composed of the compound represented by the general formula (5) and having an average thickness of 10 nm.

<5A> Next, a 1.2 wt % tetramethylbenzene solution of a compound represented by the general formula (6) was applied, by the ink jet method, inside the partition wall in the region where the red light-emitting element 301R was to be formed.

<5B> Next, a 1.2 wt % tetramethylbenzene solution of a compound represented by the general formula (19) was applied, by the ink jet method, inside the partition wall in the region where the green light-emitting element 301G was to be formed.

<5C> Next, the tetramethylbenzene solution of the compound represented by the general formula (6) and the tetramethylbenzene solution of the compound represented by the general formula (19) applied in the steps 5A and 5B were dried and then the substrate 321 was heated in a nitrogen atmosphere. As a result, a red light-emitting function layer 305R composed of the compound represented by the general formula (6) and having an average thickness of 60 nm and a green light-emitting function layer 305G composed of the compound represented by the general formula (19) and having an average thickness of 60 nm were formed on the intermediate layers 342R and 342G, respectively.

<6> Next, a vapor-deposited film containing Cs and having an average thickness of 0.5 nm was formed by a vacuum deposition method using $Cs_2CO_3$ as an evaporation source on the red light-emitting function layer 305R, the green light-emitting function layer 305G, and the hole injection layer 341B which were disposed in the region where the red light-emitting element 301R was to be formed, the region where the green light-emitting element 301G was to be formed, and the region where the blue light-emitting element 301B was to be formed, respectively. As a result, a first electron injection layer 361 was formed.

The "thin film containing Cs" refers to a thin film containing at least elemental Cs which is a metal material constituting a Cs salt. A metal-containing layer may be a layer containing a metal salt which is an evaporation material. As a result of a preparatory experiment conducted separately, the inventors observed a phenomenon described below and thus indirectly confirmed that a vacuum-deposited film is composed of not only a Cs salt but also elemental Cs.

Specifically, it was confirmed that when an Al deposited film is laminated on a deposited film formed using $Cs_2CO_3$ as an evaporation source, air exposure causes foaming in the Al surface to form remarked unevenness in the surface. If $Cs_2CO_3$ is deposited to form the evaporated film, a significant change does not occur in the laminated Al film. However, it is considered that the deposited film contains elemental Cs, and thus an element Cs portion is rapidly oxidized and absorbs moisture due to air exposure.

<7> Next, a hole transport layer 343 composed of α-NPD and having an average thickness of 10 nm was formed on the first electron injection layer 361 by a vacuum deposition method.

<8> Next, a blue light-emitting function layer 305B composed of a blue light-emitting function layer constituent material described below and having an average thickness of 20 nm was formed on the hole transport layer 343 by a vacuum deposition method.

As the constituent material of the blue light-emitting function layer 305B, a compound represented by the formula (11) was used as a host material, and a compound represented by the formula (14) was used as a guest material. The content (doping amount) of the guest material (dopant) in the blue light-emitting function layer was 5.0% in terms of the weight ratio to the host material.

<9> Next, an electron transport layer 362 composed of tris(8-quinolinolato) aluminum ($Alq_3$) and having an average thickness of 20 nm was formed on the blue light-emitting function layer 305B by a vacuum deposition method.

<10> Next, a second electron injection layer 363 composed of lithium fluoride (LiF) and having an average thickness of 1 nm was formed on the electron transport layer 362 by a vacuum deposition method.

<11> Next, a cathode 308 composed of Al and having an average thickness of 100 nm was formed on the second electron injection layer 363 by a vacuum deposition method.

<12> Next, a protective cover (sealing member) made of glass was provided to cover the formed layers, and then fixed and sealed with an epoxy resin.

Figure 5:
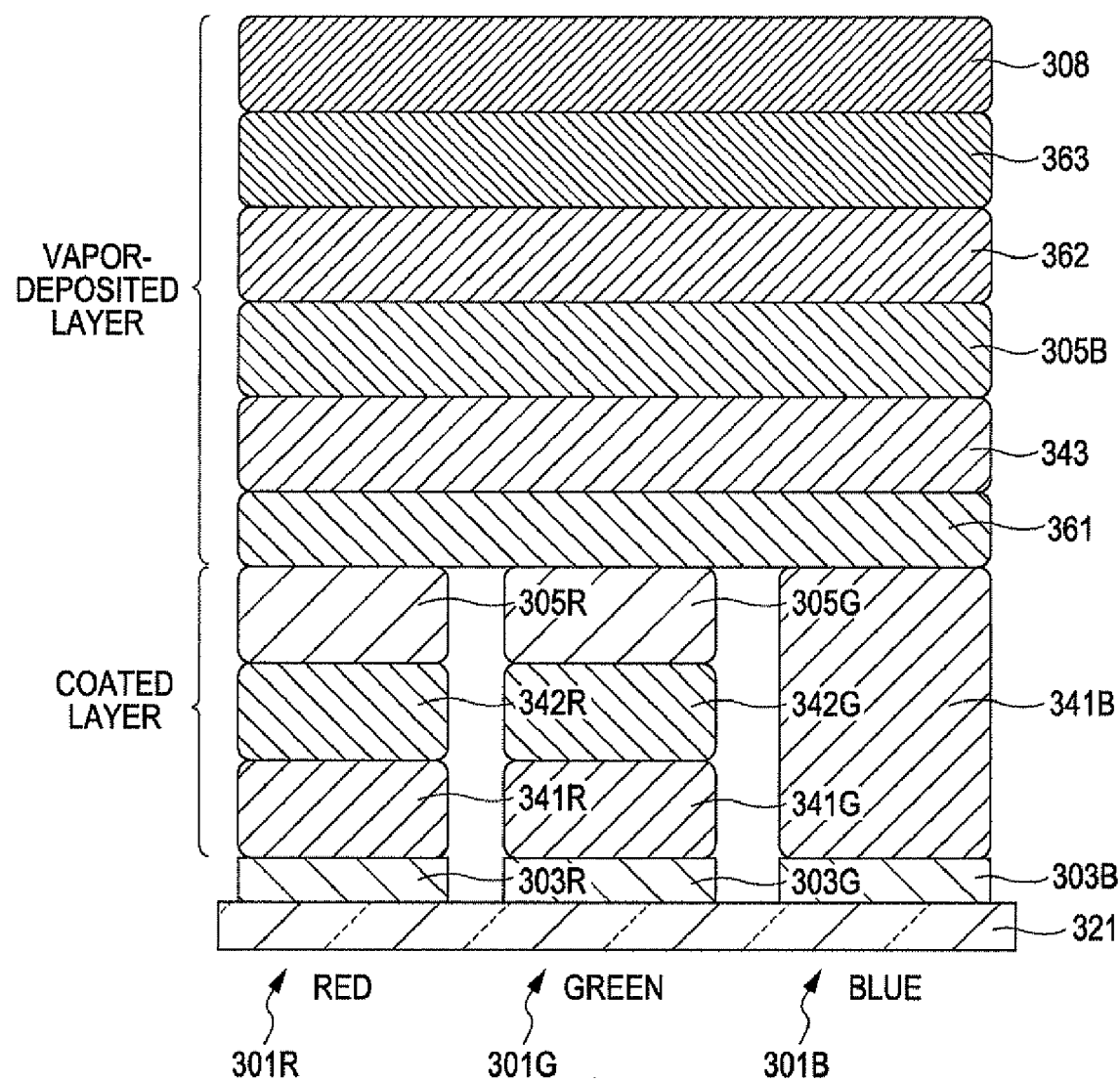
FIG. 5 is a longitudinal sectional view schematically showing a display device of Examples 1 and 2.

A display device having a bottom-emission structure shown in FIG. 5 was produced through the above-described steps.

Example 2

A display device having a bottom-emission structure shown in FIG. 5 was produced by the same method as in Example 1 except that the step <5A>, the step <5B>, the step <5C>, the step <7>, the step <8>, and the step <9> in Example 1 were changed to step <5A'>, step <5B'>, step <5C'>, the step <7'>, the step <8'>, and the step <9'>, respectively, described below.

<5A'> Next, a 1.2 wt % tetramethylbenzene solution of a compound represented by the general formula (7) was applied, by the ink jet method, inside the partition wall in the region where the red light-emitting element 301R was to be formed.

<5B'> Next, a 1.2 wt % tetramethylbenzene solution of a compound represented by the general formula (20) was applied, by the ink jet method, inside the partition wall in the region where the green light-emitting element 301G was to be formed.

<5C'> Next, the tetramethylbenzene solution of the compound represented by the general formula (7) and the tetramethylbenzene solution of the compound represented by the general formula (20) applied in the steps 5A' and 5B' was dried and then the substrate 321 was heated in a nitrogen atmosphere. As a result, a red light-emitting function layer 305R composed of the compound represented by the general formula (7) and having an average thickness of 50 nm and a green light-emitting function layer 305G composed of the compound represented by the general formula (20) and having an average thickness of 50 nm were formed on the intermediate layers 342R and 342G, respectively.

<7'> Next, a hole transport layer 343 composed of a compound represented by the formula (9) and having an average thickness of 10 nm was formed on the first electron injection layer 361 by a vacuum deposition method.

<8'> Next, a blue light-emitting function layer 305B composed of a blue light-emitting function layer constituent material described below and having an average thickness of 10 nm was formed on the hole transport layer 343 by a vacuum deposition method.

As the constituent material of the blue light-emitting function layer 305B, a compound represented by the formula (13) was used as a host material, and a compound represented by the formula (15) was used as a guest material. The content (doping amount) of the guest material (dopant) in the blue light-emitting function layer was 5.0% in terms of the weight ratio to the host material.

<9'> Next, an electron transport layer 362 composed of a compound represented by the formula (17) and having an average thickness of 30 nm was formed on the blue light-emitting function layer 305B by a vacuum deposition method.

Comparative Example 1

<1> First, a transparent glass substrate having an average thickness of 1.0 mm was prepared as a substrate 421. Next, an ITO film having an average thickness of 50 nm was formed on the substrate 421 by a sputtering method, and then the ITO film was patterned by photolithography to form ITO electrodes (anodes 403R, 403G, and 403B/individual electrodes).

Then, the substrate 421 on which the anodes 403R, 403G, and 403B were formed was dipped, in turn, in acetone and 2-propanol, ultrasonically washed, and then treated with oxygen plasma.

<2> Next, an insulating layer composed of an acrylic resin was formed, by a spin coating method, on the substrate 421 on which the anodes 403R, 403G, and 403B were formed. Then, the insulating layer was patterned by photolithography so that the ITO electrodes were exposed, thereby forming a partition wall. Further, the surface of the substrate 421 on which the partition wall was formed was plasma-treated with $O_2$ gas used as treatment gas. As a result, the surfaces of the anodes 403R, 403G, and 403B and the surface (including the wall surfaces) of the partition wall were made lyophilic by activation. Then, the surface of the substrate 421 on which the partition wall was formed was plasma-treated with $CF_4$ gas used as treatment gas. As a result, only the surface of the partition wall composed of an acrylic resin was made liquid-repellent by reaction with the $CF_4$ gas.

<3A> Next, a 1.0 wt % PEDOT/PSS aqueous dispersion solution was applied, by the ink jet method, inside the partition wall in a region where a red light-emitting element 401R was to be formed.

<3B> Next, a 1.0 wt % PEDOT/PSS aqueous dispersion solution was applied, by the ink jet method, inside the partition wall in a region where a green light-emitting element 401G was to be formed.

<3C> Next, a 1.0 wt % PEDOT/PSS aqueous dispersion solution was applied, by the ink jet method, inside the partition wall in a region where a blue light-emitting element 401B was to be formed.

<3D> Next, the PEDOT/PSS aqueous dispersion solution applied in each of the steps 3A, 3B, and 3C was dried and then the substrate 421 was heated in air to form ion-conducting hole-injection layers 441R, 441G, and 441B on the anodes 403R, 403G, and 403B, respectively, the ion-conducting hole injection layers 441R, 441G, and 441B being composed of PEDOT/PSS and having an average thickness of 50 nm.

<4A> Next, a 1.5 wt % tetramethylbenzene solution of a compound represented by the general formula (5) was applied, by the ink jet method, inside the partition wall in the region where the red light-emitting element 401R was to be formed.

<4B> Next, a 1.5 wt % tetramethylbenzene solution of a compound represented by the general formula (5) was applied, by the ink jet method, inside the partition wall in the region where the green light-emitting element 401G was to be formed.

<4C> Next, the tetramethylbenzene solution of the compound represented by the general formula (5) applied in each of the steps 4A and 413 was dried and then the substrate 421 was heated in a nitrogen atmosphere. Then, the substrate 421 was further rinsed with xylene in the region where the red light-emitting element 401R was to be formed and the region where the green light-emitting element 401G was to be formed. As a result, intermediate layers 442R and 442G were formed on the hole injection layers 441R and 441G, respectively, the intermediate layers 442R and 442G being composed of the compound represented by the general formula (5) and having an average thickness of 10 nm.

<5A> Next, a 1.2 wt % tetramethylbenzene solution of a compound represented by the general formula (6) was applied, by the ink jet method, inside the partition wall in the region where the red light-emitting element 401R was to be formed.

<5B> Next, a 1.2 wt % tetramethylbenzene solution of a compound represented by the general formula (19) was applied, by the ink jet method, inside the partition wall in the region where the green light-emitting element 401G was to be formed.

<5C> Next, a 1.0 wt % tetralin solution of α-NPD was applied, by the ink jet method, inside the partition wall in the region where the blue light-emitting element 401B was to be formed.

<5D> Next, the tetramethylbenzene solution of the compound represented by the general formula (6), the tetramethylbenzene solution of the compound represented by the general formula (19), and the α-NPD tetralin solution applied in the steps 5A, 5B, and 5C, respectively, were dried and then the substrate 421 was heated in a nitrogen atmosphere. As a result, a red light-emitting function layer 405R composed of the compound represented by the general formula (6) and having an average thickness of 60 nm and a green light-emitting function layer 405G composed of the compound represented by the general formula (19) and having an average thickness of 60 nm were formed on the intermediate layers 442R and 442G, respectively. Further, a hole transport layer 443B composed of α-NPD and having an average thickness of 10 nm was formed on the hole injection layer 441B.

<6> Next, a blue light-emitting function layer 405B composed of a constituent material described below and having an average thickness of 20 nm was formed, by a vacuum deposition method, on the red light-emitting function layer 405R, the green light-emitting function layer 405G, and the hole transport layer 443B which were disposed in the region where the red light-emitting element 401R was to be formed, the region where the green light-emitting element 401G was to be formed, and the region where the blue light-emitting element 401B was to be formed, respectively.

As the constituent material of the blue light-emitting function layer 405B, a compound represented by the formula (11) was used as a host material, and a compound represented by the formula (14) was used as a guest material. The content (doping amount) of the guest material (dopant) in the blue light-emitting function layer 405B was 5.0% in terms of the weight ratio to the host material.

<7> Next, an electron transport layer 462 composed of tris(8-quinolinolato) aluminum ($Alq_3$) and having an average thickness of 20 nm was Ruined on the blue light-emitting function layer 405B by a vacuum deposition method.

<8> Next, a second electron injection layer 463 composed of lithium fluoride (LiF) and having an average thickness of 1 nm was formed on the electron transport layer 462 by a vacuum deposition method.

<9> Next, a cathode 408 composed of Al and having an average thickness of 100 nm was formed on the second electron injection layer 463 by a vacuum deposition method.

<10> Next, a protective cover (sealing member) made of glass was provided to cover the formed layers, and then fixed and sealed with an epoxy resin.

Figure 6:
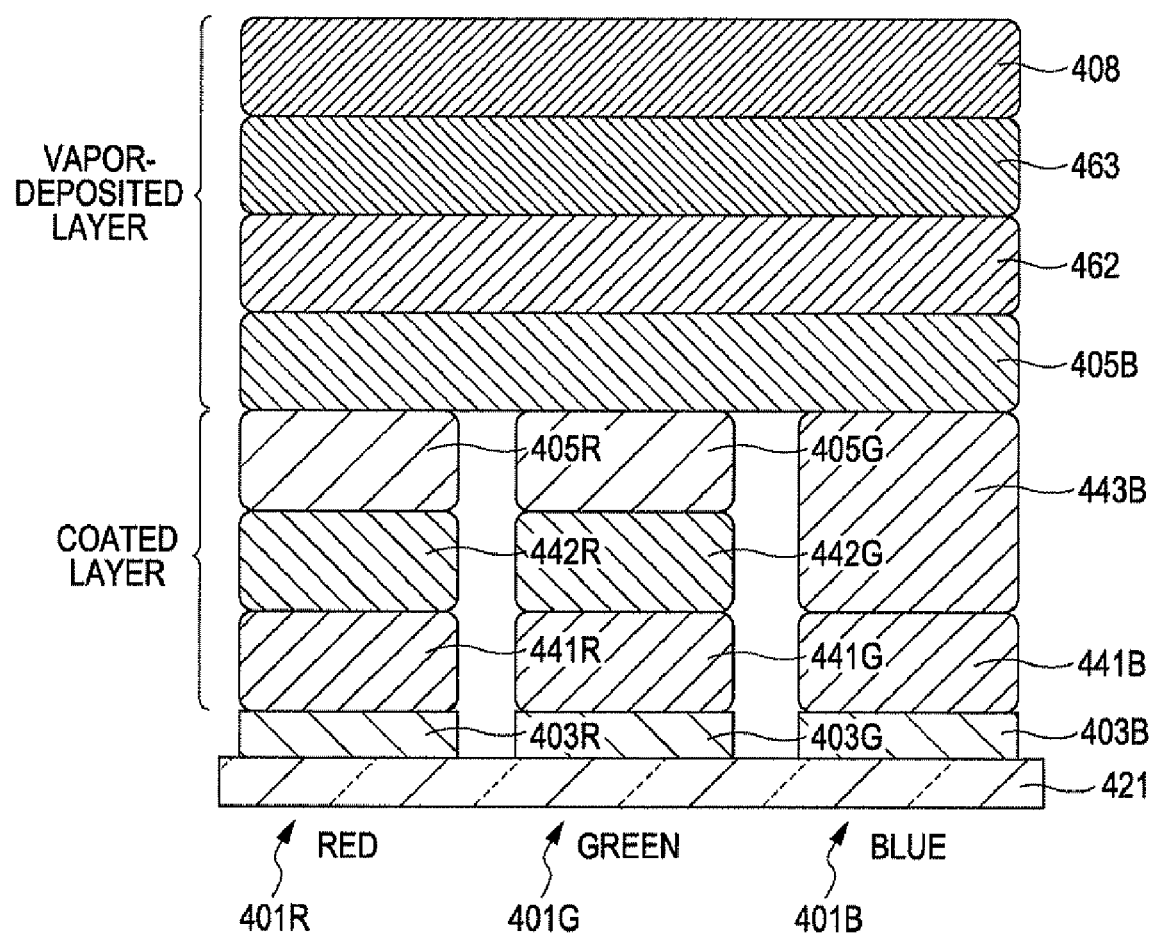
FIG. 6 is a longitudinal sectional view schematically showing a display device of Comparative Example 1.

A display device having a bottom-emission structure shown in FIG. 6 was produced through the above-described steps. In the display device, the first electron injection layer 361 of Example 1 was omitted, and the hole transport layer 443B was formed in place of the hole transport layer 343.

Comparative Example 2

<1> First, a transparent glass substrate having an average thickness of 1.0 mm was prepared as a substrate 521. Next, an ITO film having an average thickness of 50 nm was formed on the substrate 521 by a sputtering method, and then the ITO film was patterned by photolithography to form ITO electrodes (anodes 503R, 503G, and 503B/individual electrodes).

Then, the substrate 521 on which the anodes 503R, 503G, and 503B were formed was dipped, in turn, in acetone and 2-propanol, ultrasonically washed, and then treated with oxygen plasma.

<2> Next, an insulating layer composed of an acrylic resin was formed, by a spin coating method, on the substrate 521 on which the anodes 503R, 503G, and 503B were formed. Then, the insulating layer was patterned by photolithography so that the ITO electrodes were exposed, thereby forming a partition wall. Further, the surface of the substrate 521 on which the partition wall was formed was plasma-treated with $O_2$ gas used as treatment gas. As a result, the surfaces of the anodes 503R, 503G, and 503B and the surface (including the wall surfaces) of the partition wall were made lyophilic by activation. Then, the surface of the substrate 521 on which the partition wall was formed was plasma-treated with $CF_4$ gas used as treatment gas. As a result, only the surface of the partition wall composed of an acrylic resin was made liquid-repellent by reaction with the $CF_4$ gas.

<3A> Next, a 1.0 wt % PEDOT/PSS aqueous dispersion solution was applied, by the ink jet method, inside the partition wall in a region where a red light-emitting element 501R was to be formed.

<3B> Next, a 1.0 wt % PEDOT/PSS aqueous dispersion solution was applied, by the ink jet method, inside the partition wall in a region where a green light-emitting element 501G was to be formed.

<3C> Next, a 1.0 wt % PEDOT/PSS aqueous dispersion solution was applied, by the ink jet method, inside the partition wall in a region where a blue light-emitting element 501B was to be formed.

<3D> Next, the PEDOT/PSS aqueous dispersion solution applied in each of the steps 3A, 3B, and 3C was dried and then the substrate 521 was heated in air to form ion-conducting hole-injection layers 541R, 541G, and 541B on the anodes 503R, 503G, and 503B, respectively, the ion-conducting hole injection layers 541R, 541G, and 541B being composed of PEDOT/PSS and having an average thickness of 50 nm.

<4A> Next, a 1.5 wt % tetramethylbenzene solution of a compound represented by the general formula (5) was applied, by the ink jet method, inside the partition wall in the region where the red light-emitting element 501R was to be formed.

<4B> Next, a 1.5 wt % tetramethylbenzene solution of a compound represented by the general formula (5) was applied, by the ink jet method, inside the partition wall in the region where the green light-emitting element 501G was to be formed.

<4C> Next, the tetramethylbenzene solution of the compound represented by the general formula (5) applied in each of the steps 4A and 4B was dried and then the substrate 521 was heated in a nitrogen atmosphere. Then, the substrate 521 was further rinsed with xylene in the region where the red light-emitting element 501R was to be formed and the region where the green light-emitting element 501G was to be formed. As a result, intermediate layers 542R and 542G were formed on the hole injection layers 541R and 541G, respectively, the intermediate layers 542R and 542G being composed of the compound represented by the general formula (5) and having an average thickness of 10 nm.

<5A> Next, a 1.2 wt % tetramethylbenzene solution of a compound represented by the general formula (6) was applied, by the ink jet method, inside the partition wall in the region where the red light-emitting element 501R was to be formed.

<5B> Next, a 1.2 wt % tetramethylbenzene solution of a compound represented by the general formula (19) was applied, by the ink jet method, inside the partition wall in the region where the green light-emitting element 501G was to be formed.

<5C> Next, a 1.0 wt % tetralin solution of α-NPD was applied, by the ink jet method, inside the partition wall in the region where the blue light-emitting element 501B was to be formed.

<5D> Next, the tetramethylbenzene solution of the compound represented by the general formula (6), the tetramethylbenzene solution of the compound represented by the general formula (19), and the α-NPD tetralin solution applied in the steps 5A, 5B, and 5C were dried and then the substrate 521 was heated in a nitrogen atmosphere. As a result, a red light-emitting function layer 505R composed of the compound represented by the general formula (6) and having an average thickness of 60 nm and a green light-emitting function layer 505G composed of the compound represented by the general formula (19) and having an average thickness of 60 nm were formed on the intermediate layers 542R and 542G, respectively. Further, a hole transport layer 543B composed of α-NPD and having an average thickness of 10 nm was formed on the hole injection layer 541B.

<6> Next, a vapor-deposited film containing Cs and having an average thickness of 0.5 nm was formed by a vacuum deposition method using $Cs_2CO_3$ as an evaporation source on the red light-emitting function layer 505R, the green light-emitting function layer 505G, and the hole transport layer 543B which were disposed in the region where the red light-emitting element 501R was to be formed, the region where the green light-emitting element 501G was to be formed, and the region where the blue light-emitting element 501B was to be formed, respectively. As a result, a first electron injection layer 561 was formed.

<7> Next, a blue light-emitting function layer 505B composed of a constituent material described below and having an average thickness of 20 nm was formed, by a vacuum deposition method, on the first electron injection layer 561.

As the constituent material of the blue light-emitting function layer 505B, a compound represented by the formula (11) was used as a host material, and a compound represented by the formula (14) was used as a guest material. The content (doping amount) of the guest material (dopant) in the blue light-emitting function layer 505B was 5.0% in terms of the weight ratio to the host material.

<8> Next, an electron transport layer 562 composed of tris(8-quinolinolato) aluminum ($Alq_3$) and having an average thickness of 20 nm was formed on the blue light-emitting function layer 505B by a vacuum deposition method.

<9> Next, a second electron injection layer 563 composed of lithium fluoride (LiF) and having an average thickness of 1 nm was fowled on the electron transport layer 562 by a vacuum deposition method.

<10> Next, a cathode 508 composed of Al and having an average thickness of 100 nm was formed on the second electron injection layer 563 by a vacuum deposition method.

<11> Next, a protective cover (sealing member) made of glass was provided to cover the formed layers, and then fixed and sealed with an epoxy resin.

Figure 7:
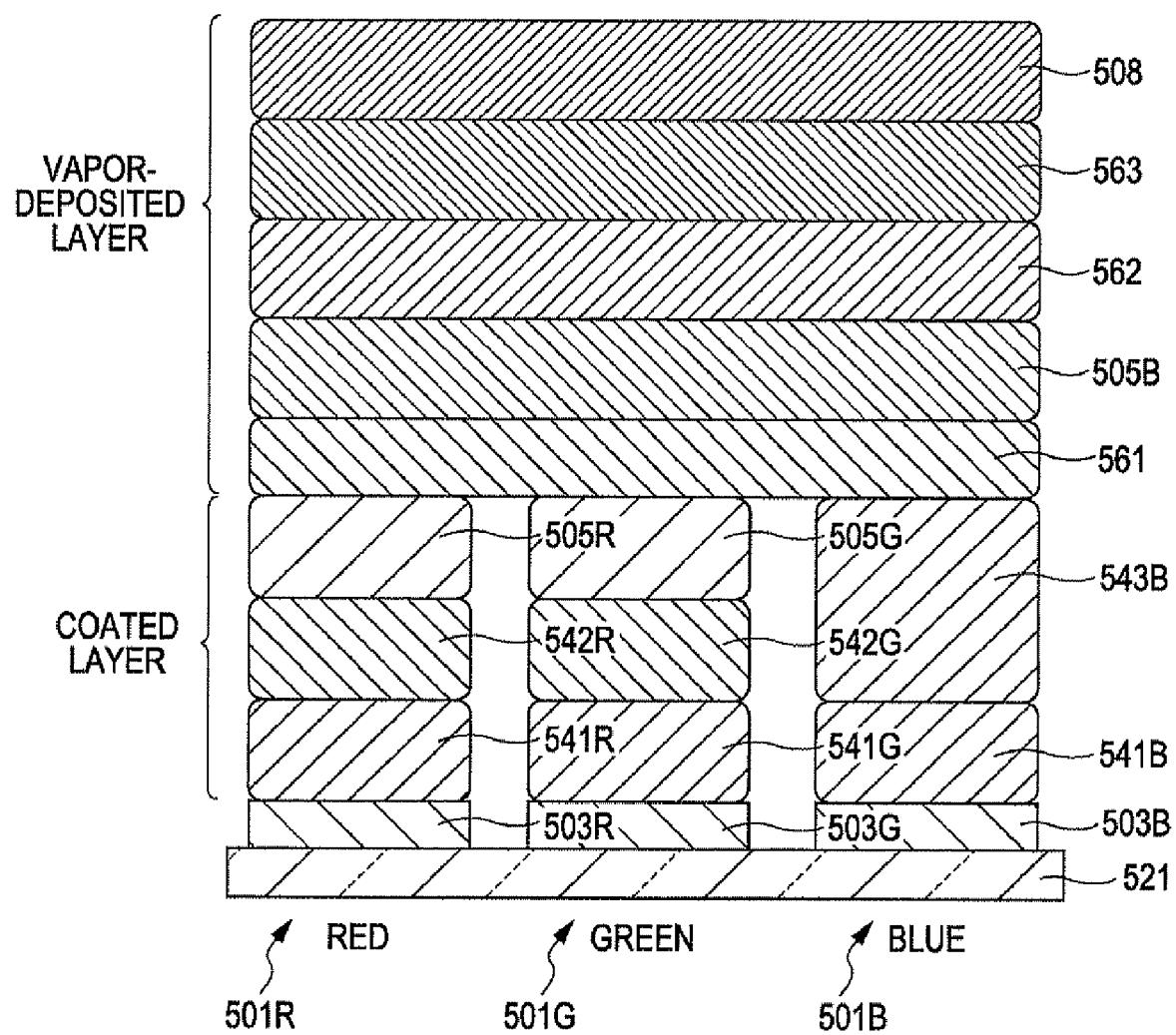
FIG. 7 is a longitudinal sectional view schematically showing a display device of Comparative Example 2.

A display device having a bottom-emission structure shown in FIG. 7 was produced through the above-described steps. In the display device, the hole transport layer 543B was formed in place of the hole transport layer 343 of Example 1.

Comparative Example 3

<1> First, a transparent glass substrate having an average thickness of 1.0 mm was prepared as a substrate 621. Next, an ITO film having an average thickness of 50 nm was formed on the substrate 621 by a sputtering method, and then the ITO film was patterned by photolithography to form ITO electrodes (anodes 603R, 603G, and 603B/individual electrodes).

Then, the substrate 621 on which the anodes 603R, 603G, and 603B were formed was dipped, in turn, in acetone and 2-propanol, ultrasonically washed, and then treated with oxygen plasma.

<2> Next, an insulating layer composed of an acrylic resin was formed, by a spin coating method, on the substrate 621 on which the anodes 603R, 603G, and 603B were formed. Then, the insulating layer was patterned by photolithography so that the ITO electrodes were exposed, thereby forming a partition wall. Further, the surface of the substrate 621 on which the partition wall was formed was plasma-treated with $O_2$ gas used as treatment gas. As a result, the surfaces of the anodes 603R, 603G, and 603B and the surface (including the wall surfaces) of the partition wall were made lyophilic by activation. Then, the surface of the substrate 621 on which the partition wall was formed was plasma-treated with $CF_4$ gas used as treatment gas. As a result, only the surface of the partition wall composed of an acrylic resin was made liquid-repellent by reaction with the $CF_4$ gas.

<3A> Next, a 1.0 wt % PEDOT/PSS aqueous dispersion solution was applied, by the ink jet method, inside the partition wall in a region where a red light-emitting element 601R was to be formed.

<3B> Next, a 1.0 wt % PEDOT/PSS aqueous dispersion solution was applied, by the ink jet method, inside the partition wall in a region where a green light-emitting element 601G was to be formed.

<3C> Next, a 1.0 wt % PEDOT/PSS aqueous dispersion solution was applied, by the ink jet method, inside the partition wall in a region where a blue light-emitting element 601B was to be formed.

<3D> Next, the PEDOT/PSS aqueous dispersion solution applied in each of the steps 3A, 3B, and 3C was dried and then the substrate 621 was heated in air to form ion-conducting hole-injection layers 641R, 641G, and 641B on the anodes 603R, 603G, and 603B, respectively, the ion-conducting hole injection layers 641R, 641G, and 641B being composed of PEDOT/PSS and having an average thickness of 50 nm.

<4A> Next, a 1.5 wt % tetramethylbenzene solution of a compound represented by the general formula (5) was applied, by the ink jet method, inside the partition wall in the region where the red light-emitting element 601R was to be formed.

<4B> Next, a 1.5 wt % tetramethylbenzene solution of a compound represented by the general formula (5) was applied, by the ink jet method, inside the partition wall in the region where the green light-emitting element 601G was to be formed.

<4C> Next, the tetramethylbenzene solution of the compound represented by the general formula (5) applied in each of the steps 4A and 4B was dried and then the substrate 621 was heated in a nitrogen atmosphere. Then, the substrate 621 was further rinsed with xylene in the region where the red light-emitting element 601R was to be formed and the region where the green light-emitting element 601G was to be formed. As a result, intermediate layers 642R and 642G were formed on the hole injection layers 641R and 641G, respectively, the intermediate layers 642R and 642G being composed of the compound represented by the general formula (5) and having an average thickness of 10 nm.

<5A> Next, a 1.2 wt % tetramethylbenzene solution of a compound represented by the general formula (6) was applied, by the ink jet method, inside the partition wall in the region where the red light-emitting element 601R was to be formed.

<5B> Next, a 1.2 wt % tetramethylbenzene solution of a compound represented by the general formula (19) was applied, by the ink jet method, inside the partition wall in the region where the green light-emitting element 601G was to be formed.

<5C> Next, the tetramethylbenzene solution of the compound represented by the general formula (6) and the tetramethylbenzene solution of the compound represented by the general formula (19) applied in the steps 5A and 5B were dried and then the substrate 621 was heated in a nitrogen atmosphere. As a result, a red light-emitting function layer 605R composed of the compound represented by the general formula (6) and having an average thickness of 60 nm and a green light-emitting function layer 605G composed of the compound represented by the general formula (19) and having an average thickness of 60 nm were formed on the intermediate layers 642R and 642G, respectively.

<6> Next, a hole transport layer 643 composed of α-NPD and having an average thickness of 10 nm was formed, by a vacuum deposition method, on the red light-emitting function layer 605R, the green light-emitting function layer 605G, and the hole injection layer 641B which were disposed in the region where the red light-emitting element 601R was to be formed, the region where the green light-emitting element 601G was to be formed, and the region where the blue light-emitting element 601B was to be formed, respectively.

<7> Next, a blue light-emitting function layer 605B composed of a constituent material described below and having an average thickness of 20 nm was formed on the hole transport layer 643 by a vacuum deposition method.

As the constituent material of the blue light-emitting function layer 605B, a compound represented by the formula (11) was used as a host material, and a compound represented by the formula (14) was used as a guest material. The content (doping amount) of the guest material (dopant) in the blue light-emitting function layer 605B was 5.0% in terms of the weight ratio to the host material.

<8> Next, an electron transport layer 662 composed of tris(8-quinolinolato) aluminum ($Alq_3$) and having an average thickness of 20 nm was formed on the blue light-emitting function layer 605B by a vacuum deposition method.

<9> Next, a second electron injection layer 663 composed of lithium fluoride (LiF) and having an average thickness of 1 nm was formed on the electron transport layer 662 by a vacuum deposition method.

<10> Next, a cathode 608 composed of Al and having an average thickness of 100 nm was formed on the second electron injection layer 663 by a vacuum deposition method.

<11> Next, a protective cover (sealing member) made of glass was provided to cover the formed layers, and then fixed and sealed with an epoxy resin.

Figure 8:
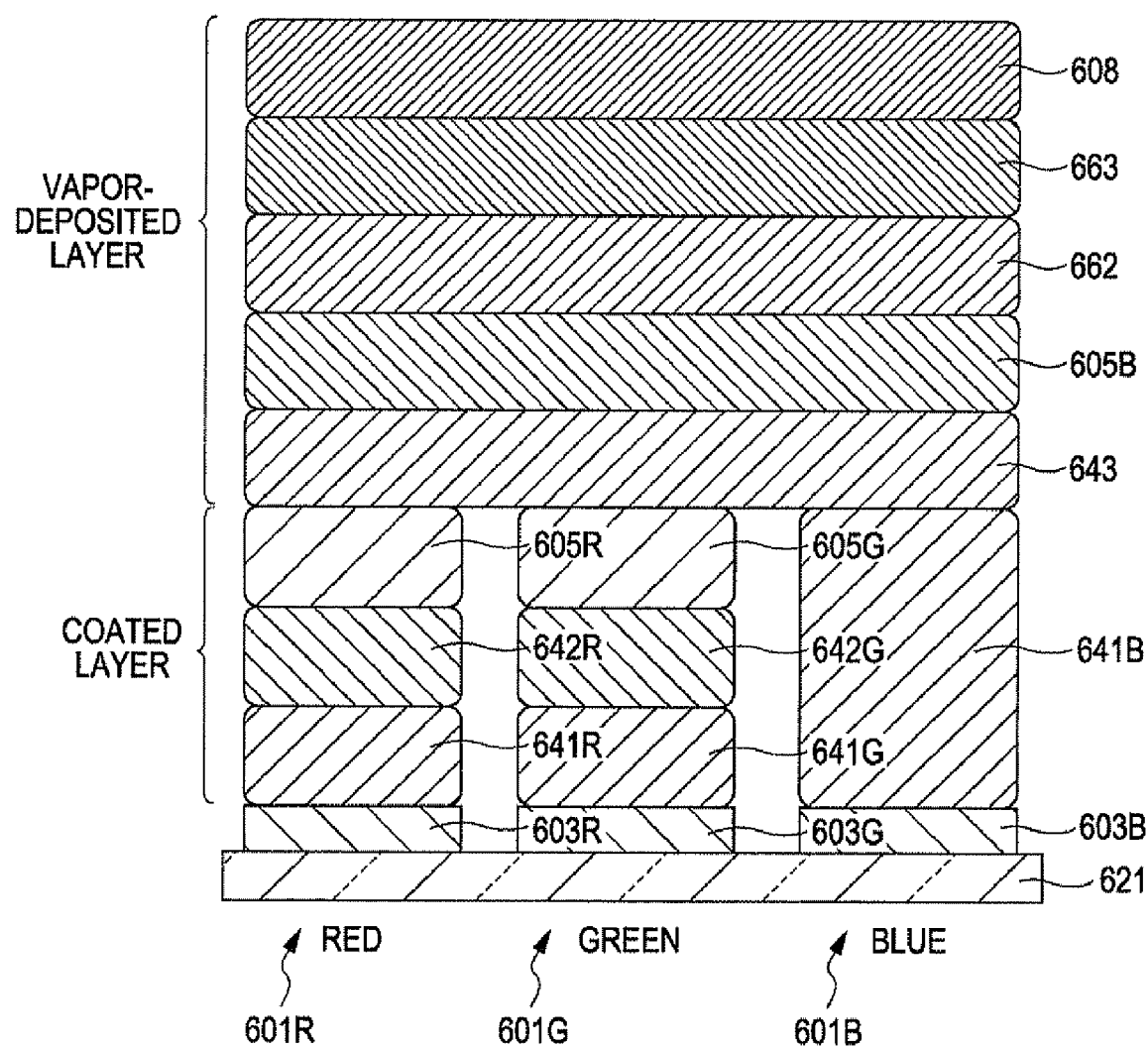
FIG. 8 is a longitudinal sectional view schematically showing a display device of Comparative Example 3.

A display device having a bottom-emission structure shown in FIG. 8 was produced through the above-described steps. In the display device, the first electron injection layer 361 of Example 1 was omitted.

Comparative Example 4R

<1> First, a transparent glass substrate having an average thickness of 1.0 mm was prepared as a substrate 721. Next, an ITO film having an average thickness of 50 nm was formed on the substrate 721 by a sputtering method, and then the ITO film was patterned by photolithography to form an ITO electrode (anode 703R).

Then, the substrate 721 on which the anode 703R was formed was dipped, in turn, in acetone and 2-propanol, ultrasonically washed, and then treated with oxygen plasma.

<2> Next, an insulating layer composed of an acrylic resin was formed, by a spin coating method, on the substrate 721 on which the anode 703R was formed. Then, the insulating layer was patterned by photolithography so that the ITO electrode was exposed, thereby forming a partition wall (bank). Further, the surface of the substrate 721 on which the partition wall was formed was plasma-treated with $O_2$ gas used as treatment gas. As a result, the surface of the anode 703R and the surface (including the wall surfaces) of the partition wall were made lyophilic by activation. Then, the surface of the substrate 721 on which the partition wall was formed was plasma-treated with $CF_4$ gas used as treatment gas. As a result, only the surface of the partition wall composed of an acrylic resin was made liquid-repellent by reaction with the $CF_4$ gas.

<3> Next, a 1.0 wt % PEDOT/PSS aqueous dispersion solution was applied, by the ink jet method, inside the partition wall in the region where the red light-emitting element 701R was to be formed. Further, the applied PEDOT/PSS aqueous dispersion solution was dried and then the substrate 721 was heated in air to form an ion-conducting hole-injection layer 741R on the anode 703R, the ion-conducting hole injection layer 741R being composed of PEDOT/PSS and having an average thickness of 50 nm.

<4> Next, a 1.5 wt % tetramethylbenzene solution of a compound represented by the general formula (5) was applied, by the ink jet method, inside the partition wall in the region where the red light-emitting element 701R was to be formed. Further, the applied tetramethylbenzene solution of the compound represented by the general formula (5) was dried and then the substrate 721 was heated in a nitrogen atmosphere. Then, the substrate 721 was further rinsed with xylene in the region where the red light-emitting element 701R was to be formed. As a result, an intermediate layer 742R composed of the compound represented by the general formula (5) and having an average thickness of 10 nm was formed on the hole injection layer 741R.

<5> Next, a 1.2 wt % tetramethylbenzene solution of a compound represented by the general formula (6) was applied, by the ink jet method, inside the partition wall in the region where the red light-emitting element 701R was to be formed. Further, the tetramethylbenzene solution of the compound represented by the general formula (6) was dried and then the substrate 721 was heated in a nitrogen atmosphere. As a result, a red light-emitting function layer 705R composed of the compound represented by the general formula (6) and having an average thickness of 80 nm was formed on the intermediate layer 742R.

<6> Next, a vapor-deposited film containing Cs and having an average thickness of 1 nm was formed by a vacuum deposition method using $Cs_2CO_3$ as an evaporation source on the red light-emitting function layer 705R. As a result, a second electron injection layer 763 was formed.

<7> Next, a cathode 708 composed of Al and having an average thickness of 100 nm was formed on the second electron injection layer 763 by a vacuum deposition method.

<8> Next, a protective cover (sealing member) made of glass was provided to cover the formed layers, and then fixed and sealed with an epoxy resin.

Figure 9:
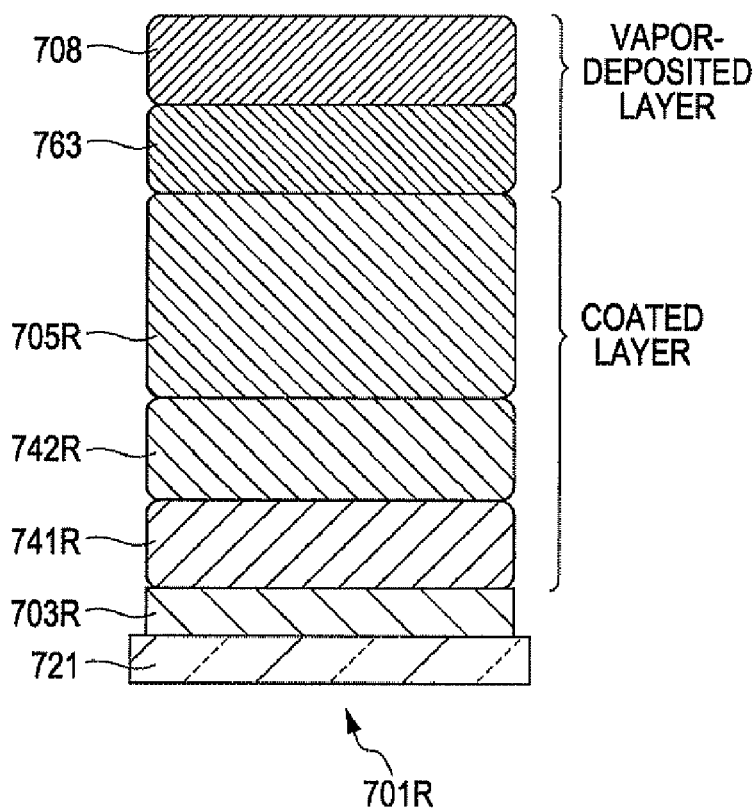
FIG. 9 is a longitudinal sectional view schematically showing a display device of Comparative Examples 4R and 7R.

The red light-emitting element 701R having a bottom-emission structure shown in FIG. 9 was produced through the above-described steps. The red light-emitting element 701R was used for normalizing the characteristics of the red light-emitting element 301R of Example 1, the red light-emitting element 401R of Comparative Example 1, the red light-emitting element 501R of Comparative Example 2, and the red light-emitting element 601R of Comparative Example 3.

Comparative Example 4G

<1> First, a transparent glass substrate having an average thickness of 1.0 mm was prepared as a substrate 821. Next, an ITO film having an average thickness of 50 nm was formed on the substrate 821 by a sputtering method, and then the ITO film was patterned by photolithography to form an ITO electrode (anode 803G).

Then, the substrate 821 on which the anode 803G was formed was dipped, in turn, in acetone and 2-propanol, ultrasonically washed, and then treated with oxygen plasma.

<2> Next, an insulating layer composed of an acrylic resin was formed, by a spin coating method, on the substrate 821 on which the anode 803R was formed. Then, the insulating layer was patterned by photolithography so that the ITO electrode was exposed, thereby forming a partition wall (bank). Further, the surface of the substrate 821 on which the partition wall was formed was plasma-treated with $O_2$ gas used as treatment gas. As a result, the surface of the anode 803G and the surface (including the wall surfaces) of the partition wall were made lyophilic by activation. Then, the surface of the substrate 821 on which the partition wall was formed was plasma-treated with $CF_4$ gas used as treatment gas. As a result, only the surface of the partition wall composed of an acrylic resin was made liquid-repellent by reaction with the $CF_4$ gas.

<3> Next, a 1.0 wt % PEDOT/PSS aqueous dispersion solution was applied, by the ink jet method, inside the partition wall in a region where a green light-emitting element 801G was to be formed. Further, the applied PEDOT/PSS aqueous dispersion solution was dried and then the substrate 821 was heated in air to form an ion-conducting hole-injection layer 841G on the anode 803G, the ion-conducting hole injection layer 841G being composed of PEDOT/PSS and having an average thickness of 50 nm.

<4> Next, a 1.5 wt % tetramethylbenzene solution of a compound represented by the general formula (5) was applied, by the ink jet method, inside the partition wall in the region where the green light-emitting element 801G was to be formed. Further, the applied tetramethylbenzene solution of the compound represented by the general formula (5) was dried and then the substrate 821 was heated in a nitrogen atmosphere. Then, the substrate 821 was further rinsed with xylene in the region where the green light-emitting element 801G was to be formed. As a result, an intermediate layer 842G composed of the compound represented by the general formula (5) and having an average thickness of 10 nm was formed on the hole injection layer 841G.

<5> Next, a 1.2 wt % tetramethylbenzene solution of a compound represented by the general formula (19) was applied, by the ink jet method, inside the partition wall in the region where the green light-emitting element 801G was to be formed. Further, the tetramethylbenzene solution of the compound represented by the general formula (19) was dried and then the substrate 821 was heated in a nitrogen atmosphere. As a result, a green light-emitting function layer 805G composed of the compound represented by the general formula (19) and having an average thickness of 80 nm was formed on the intermediate layer 842G.

<6> Next, a vapor-deposited film containing Cs and having an average thickness of 1 nm was formed by a vacuum deposition method using $Cs_2CO_3$ as an evaporation source on the green light-emitting function layer 805G. As a result, a second electron injection layer 863 was formed.

<7> Next, a cathode 808 composed of Al and having an average thickness of 100 nm was formed on the second electron injection layer 863 by a vacuum deposition method.

<8> Next, a protective cover (sealing member) made of glass was provided to cover the formed layers, and then fixed and sealed with an epoxy resin.

Figure 10:
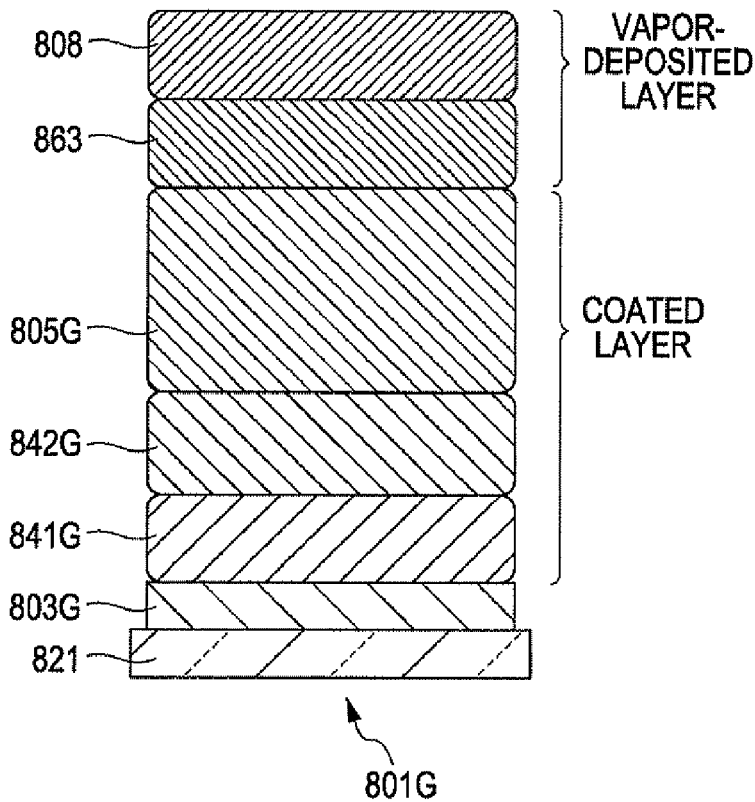
FIG. 10 is a longitudinal sectional view schematically showing a display device of Comparative Examples 4G and 7G.

The green light-emitting element 801G having a bottom-emission structure shown in FIG. 10 was produced through the above-described steps. The green light-emitting element 801G was used for normalizing the characteristics of the green light-emitting element 301G of Example 1, the green light-emitting element 401G of Comparative Example 1, the green light-emitting element 501G of Comparative Example 2, and the green light-emitting element 601G of Comparative Example 3.

Comparative Example 4B

<1> First, a transparent glass substrate having an average thickness of 1.0 mm was prepared as a substrate 921. Next, an ITO film having an average thickness of 50 nm was formed on the substrate 921 by a sputtering method, and then the ITO film was patterned by photolithography to form an ITO electrode (anode 903B).

Then, the substrate 921 on which the anode 903B was formed was dipped, in turn, in acetone and 2-propanol, ultrasonically washed, and then treated with oxygen plasma.

<2> Next, an insulating layer composed of an acrylic resin was formed, by a spin coating method, on the substrate 921 on which the anode 903B was formed. Then, the insulating layer was patterned by photolithography so that the ITO electrode was exposed, thereby forming a partition wall (bank). Further, the surface of the substrate 921 on which the partition wall was formed was plasma-treated with $O_2$ gas used as treatment gas. As a result, the surface of the anode 903B and the surface (including the wall surfaces) of the partition wall were made lyophilic by activation. Then, the surface of the substrate 921 on which the partition wall was formed was plasma-treated with $CF_4$ gas used as treatment gas. As a result, only the surface of the partition wall composed of an acrylic resin was made liquid-repellent by reaction with the $CF_4$ gas.

<3> Next, a 1.0 wt % PEDOT/PSS aqueous dispersion solution was applied, by the ink jet method, inside the partition wall in a region where a blue light-emitting element 901B was to be formed. Further, the applied PEDOT/PSS aqueous dispersion solution was dried and then the substrate 921 was heated in air to form an ion-conducting hole-injection layer 941B on the anode 903B, the ion-conducting hole injection layers 941B being composed of PEDOT/PSS and having an average thickness of 50 nm.

<4> Next, a hole transport layer 943B composed of α-NPD and having an average thickness of 10 nm was formed on the hole injection layer 941B by a vacuum deposition method.

<5> Next, a blue light-emitting function layer 905B composed of a constituent material described below and having an average thickness of 20 nm was formed on the hole transport layer 943B by a vacuum deposition method.

As the constituent material of the blue light-emitting function layer 905B, a compound represented by the formula (11) was used as a host material, and a compound represented by the formula (14) was used as a guest material. The content (doping amount) of the guest material (dopant) in the blue light-emitting function layer was 5.0% in terms of the weight ratio to the host material.

<6> Next, an electron transport layer 962 composed of tris(8-quinolinolato) aluminum ($Alq_3$) and having an average thickness of 20 nm was formed on the blue light-emitting function layer 905B by a vacuum deposition method.

<7> Next, a second electron injection layer 963 composed of lithium fluoride (LiF) and having an average thickness of 1 nm was formed on the electron transport layer 962 by a vacuum deposition method.

<8> Next, a cathode 908 composed of Al and having an average thickness of 100 nm was formed on the second electron injection layer 963 by a vacuum deposition method.

<9> Next, a protective cover (sealing member) made of glass was provided to cover the formed layers, and then fixed and sealed with an epoxy resin.

Figure 11:
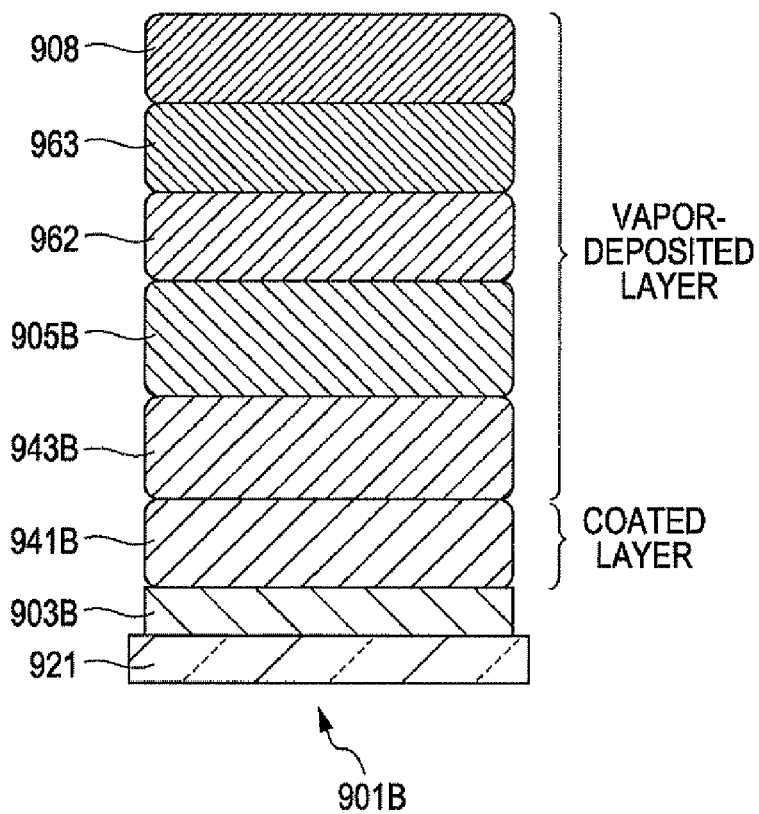
FIG. 11 is a longitudinal sectional view schematically showing a display device of Comparative Examples 4B and 7B.

The blue light-emitting element 901B having a bottom-emission structure shown in FIG. 11 was produced through the above-described steps. The blue light-emitting element 901B was used for normalizing the characteristics of the blue light-emitting element 301B of Example 1, the blue light-emitting element 401B of Comparative Example 1, the blue light-emitting element 501B of Comparative Example 2, and the blue light-emitting element 601B of Comparative Example 3.

Comparative Example 5B

<1> First, a transparent glass substrate having an average thickness of 1.0 mm was prepared as a substrate 2121. Next, an ITO electrode (anode 2103B) having an average thickness of 50 nm was formed on the substrate 2121 by a sputtering method.

Then, the substrate 2121 on which the anode 2103B was formed was dipped, in turn, in acetone and 2-propanol, ultrasonically washed, and then treated with oxygen plasma.

<2> Next, a hole injection layer 2141B was formed on the anode 2103B by a vacuum deposition method, the hole injection layer 2141B being composed of a compound represented by formula (21) below and having an average thickness of 50 nm.

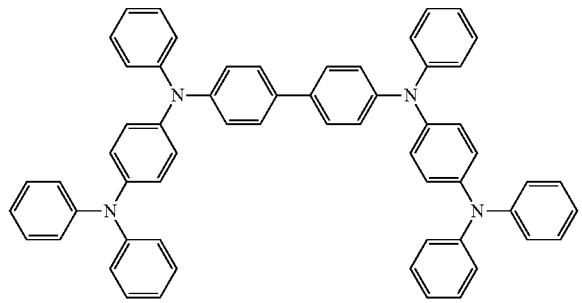

(21)

<3> Next, a hole transport layer 2143B composed of α-NPD and having an average thickness of 10 nm was formed on the hole injection layer 2141B by a vacuum deposition method.

<4> Next, a blue light-emitting function layer 2105B composed of a constituent material described below and having an average thickness of 20 nm was formed on the hole transport layer 2143B by a vacuum deposition method.

As the constituent material of the blue light-emitting function layer 2105B, a compound represented by the formula (11) was used as a host material, and a compound represented by the formula (14) was used as a guest material. The content (doping amount) of the guest material (dopant) in the blue light-emitting function layer was 5.0% in terms of the weight ratio to the host material.

<5> Next, an electron transport layer 2162 composed of tris(8-quinolinolato) aluminum ($Alq_3$) and having an average thickness of 20 nm was formed on the blue light-emitting function layer 2105B by a vacuum deposition method.

<6> Next, a second electron injection layer 2163 composed of lithium fluoride (LiF) and having an average thickness of 1 nm was formed on the electron transport layer 2162 by a vacuum deposition method.

<7> Next, a cathode 2108 composed of Al and having an average thickness of 100 nm was formed on the second electron injection layer 2163 by a vacuum deposition method.

<8> Next, a protective cover (sealing member) made of glass was provided to cover the formed layers, and then fixed and sealed with an epoxy resin.

Figure 12:
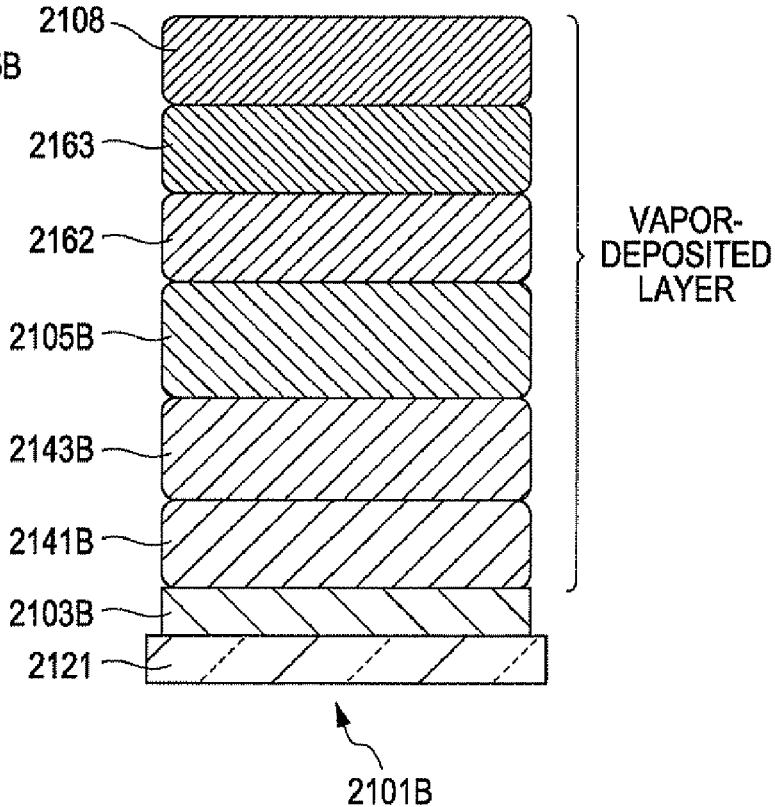
FIG. 12 is a longitudinal sectional view schematically showing a display device of Comparative Example 5B.

The blue light-emitting element 2101B having a bottom-emission structure shown in FIG. 12 was produced through the above-described steps. In the blue light-emitting element 2101B, each of the layers on the anode 2103B was a vapor-deposited layer, an ion-conducting conducting material was not used for the hole injection layer 2141B, and the first electron injection layer was not formed.

Comparative Example 6B

<1> First, a transparent glass substrate having an average thickness of 1.0 mm was prepared as a substrate 2221. Next, an ITO electrode (anode 2203B) having an average thickness of 50 nm was formed on the substrate 2221 by a sputtering method.

Then, the substrate 2221 on which the anode 2203B was formed was dipped, in turn, in acetone and 2-propanol, ultrasonically washed, and then treated with oxygen plasma.

<2> Next, a hole injection layer 2241B was formed on the anode 2203B by a vacuum deposition method, the hole injection layer 2241B being composed of a compound represented by the formula (21) and having an average thickness of 50 nm.

<3> Next, a vapor-deposited film containing Cs and having an average thickness of 0.5 nm was formed by a vacuum deposition method using $Cs_2CO_3$ as an evaporation source on the hole injection layer 2241B, forming a first electron injection layer 2261B.

<4> Next, a hole transport layer 2243E composed of α-NPD and having an average thickness of 10 nm was formed on the first electron injection layer 2261B by a vacuum deposition method.

<5> Next, a blue light-emitting function layer 2205B composed of a constituent material described below and having an average thickness of 20 nm was formed on the hole transport layer 2243B by a vacuum deposition method.

As the constituent material of the blue light-emitting function layer 2205B, a compound represented by the formula (11) was used as a host material, and a compound represented by the formula (14) was used as a guest material. The content (doping amount) of the guest material (dopant) in the blue light-emitting function layer was 5.0% in terms of the weight ratio to the host material.

<6> Next, an electron transport layer 2262 composed of tris(8-quinolinolato) aluminum ($Alq_3$) and having an average thickness of 20 nm was formed on the blue light-emitting function layer 2205B by a vacuum deposition method.

<7> Next, a second electron injection layer 2263 composed of lithium fluoride (LiF) and having an average thickness of 1 nm was formed on the electron transport layer 2262 by a vacuum deposition method.

<8> Next, a cathode 2208 composed of Al and having an average thickness of 100 nm was formed on the second electron injection layer 2263 by a vacuum deposition method.

<9> Next, a protective cover (sealing member) made of glass was provided to cover the formed layers, and then fixed and sealed with an epoxy resin.

Figure 13:
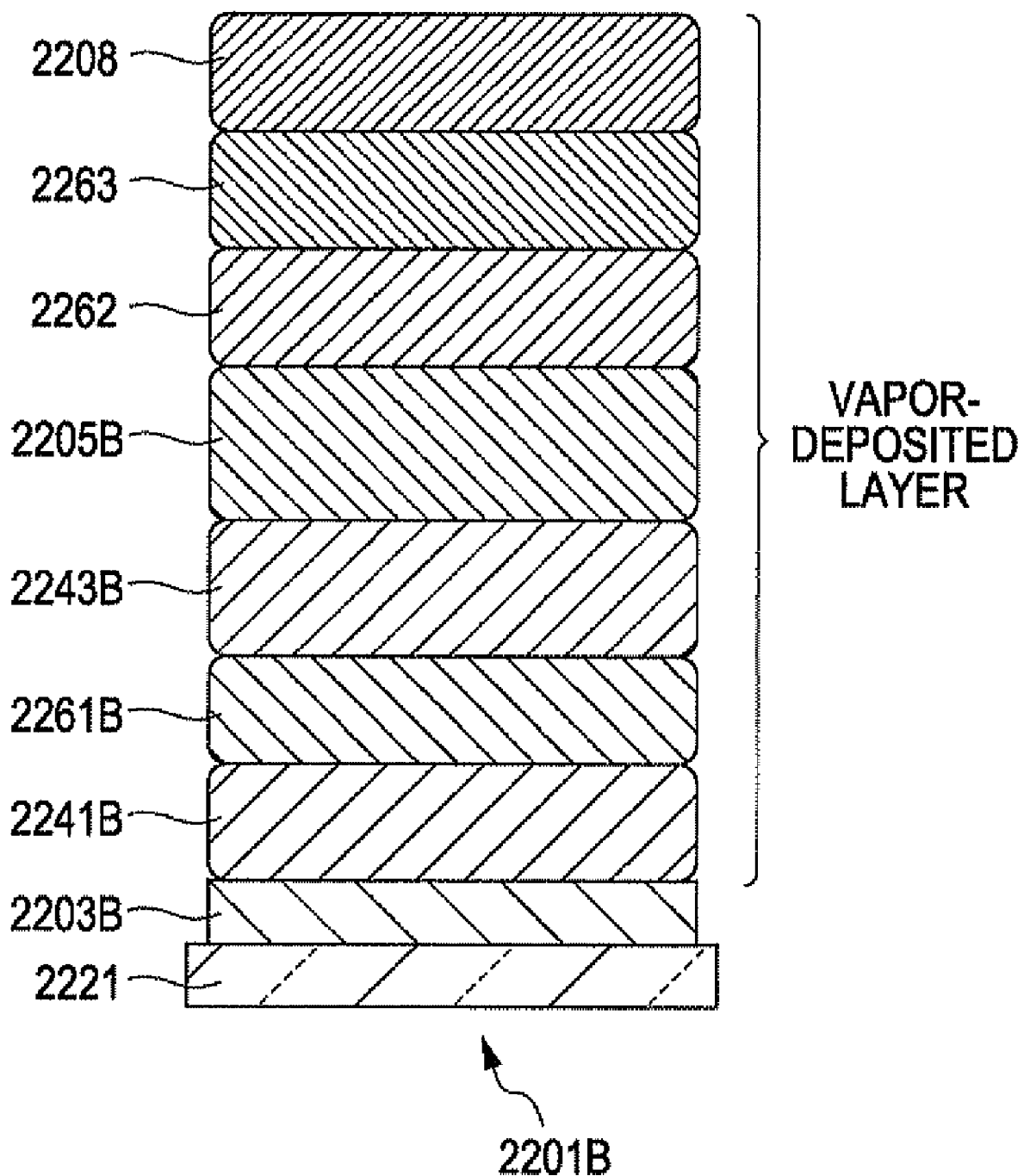
FIG. 13 is a longitudinal sectional view schematically showing a display device of Comparative Example 6B.

A blue light-emitting element including vapor-deposited layers as shown in FIG. 13 was produced through the above-described steps.

The blue light-emitting element 2201B having a bottom-emission structure as shown in FIG. 13 was produced through the above-described steps. In the blue light-emitting element 2201B, each of the layers on the anode 2203B was a vapor-deposited layer, an ion-conducting material was not used for the hole injection layer 2241B, and the first electron injection layer 2261B was formed.

Comparative Example 7R

A red light-emitting element 701R having the bottom-emission structure shown in FIG. 9 was produced by the same method as in Comparative Example 4R except that the step <5> in Comparative Example 4R was changed to step <5'> below. The red light-emitting element 701R of Comparative Example 7R was used for normalizing the characteristics of the red light-emitting element 301R of Example 2.

<5'> Next, a 1.2 wt % tetramethylbenzene solution of a compound represented by the general formula (7) was applied, by the ink jet method, inside the partition wall in the region where the red light-emitting element 701R was to be formed. Further, the tetramethylbenzene solution of the compound represented by the general formula (7) was dried and then a substrate 721 was heated in a nitrogen atmosphere. As a result, a red light-emitting function layer 705R composed of the compound represented by the general formula (7) and having an average thickness of 80 nm was formed on the intermediate layer 742R.

Comparative Example 7G

A green light-emitting element 801G having the bottom-emission structure shown in FIG. 10 was produced by the same method as in Comparative Example 4G except that the step <5> in Comparative Example 4G was changed to step <5'> below. The green light-emitting element 801G of Comparative Example 7G was used for normalizing the characteristics of the green light-emitting element 301G of Example 2.

<5'> Next, a 1.2 wt % tetramethylbenzene solution of a compound represented by the general formula (20) was applied, by the ink jet method, inside the partition wall in the region where the green light-emitting element 801G was to be formed. Further, the tetramethylbenzene solution of the compound represented by the general formula (20) was dried and then a substrate 821 was heated in a nitrogen atmosphere. As a result, a green light-emitting function layer 805G composed of the compound represented by the general formula (20) and having an average thickness of 80 nm was formed on the intermediate layer 842G.

Comparative Example 7B

A blue light-emitting element 901B having the bottom-emission structure shown in FIG. 11 was produced by the same method as in Comparative Example 4B except that the step <4>, the step <5>, and the step <6> in Comparative Example 4B were changed to step <4'>, step <5'>, and step <6'> below, respectively. The blue light-emitting element 901B of Comparative Example 7B was used for normalizing the characteristics of the blue light-emitting element 301B of Example 2.

<4'> Next, a hole transport layer 943B composed of a compound represented by the formula (9) and having an average thickness of 10 nm was formed on the hole injection layer 941B by a vacuum deposition method.

<5'> Next, a blue light-emitting function layer 905B composed of a constituent material described below and having an average thickness of 10 nm was formed on the hole transport layer 943B by a vacuum deposition method.

As the constituent material of the blue light-emitting function layer 905B, a compound represented by the formula (13) was used as a host material, and a compound represented by the formula (15) was used as a guest material. The content (doping amount) of the guest material (dopant) in the blue light-emitting function layer was 5.0% in terms of the weight ratio to the host material.

<6'> Next, an electron transport layer 962 composed of a compound represented by the formula (17) and having an average thickness of 30 nm was formed on the blue light-emitting function layer 905B by a vacuum deposition method.

2. Evaluation

With respect to the display device and the light-emitting elements of each of the examples and the comparative examples, a constant current was passed through each of the light-emitting elements so that a luminance was 10 $cd/m^2$, and, at the time, the color of light emitted from the light-emitting element was visually observed.

The reason for selecting a luminance value of as low as 10 cd/m² is that in each of the light-emitting elements of the examples and the comparative examples, if a desired luminescent color is obtained on the high-luminance side (high-current-density side), the luminescent color changes toward the low-luminance side (low-current-density side), and a desired luminescent color may not be obtained on the low-luminance side (low-current-density side). Conversely, if a desired luminescent color is obtained on the low-luminance side (low-current-density side), a desired luminescent light can be obtained on the high-luminance side (high-current-density side) without problems. The expression "a desired luminescent color is obtained" represents that red emission, green emission, and blue emission are obtained from the red light-emitting element, the green light-emitting element, and the blue light-emitting element, respectively.

In addition, with respect to the display device and the light-emitting elements of each of the examples and the comparative examples, a constant current was passed through each of the light-emitting elements so that a luminance was 1,000 cd/m², and the voltage applied to the light-emitting element and the current efficiency of light emitted from the light-emitting element were measured.

Further, with respect to the display device and the light-emitting elements of each of the examples and the comparative examples, a constant current was passed through each of the light-emitting elements so that an initial luminance was 1,000 cd/m², and the time (LT80) required until the luminance became 80% of the initial luminance was measured.

In Examples 1 and Comparative Examples 1, 2, and 3, values normalized by the values measured in Comparative Examples 4R, 4G, and 4B were determined. In addition, in Example 2, values normalized by the values measured in Comparative Examples 7R, 7G, and 7B were determined.

The results are shown in Tables 1 and 2.

TABLE 1

| Element structure | | Example 1 | Comparative Example 1 | Comparative Example 2 | Comparative Example 3 |
|---|---|---|---|---|---|
| Color | R | Red | Pink | Red | Blue |
| (10 cd/m²) | G | Green | Blue-green | Green | Blue |
| | B | Blue | Blue | Light blue | Blue |
| Normalized | R | 0.89 | 0.80 | 0.85 | —*⁵ |
| current | G | 0.89 | 0.91 | 0.78 | —*⁶ |
| efficiency | B | 1.00 | 0.82 | 0.05 | 1.00 |
| (1000 cd/m²) | | | | | |
| Normalized | R | 1.08 | 1.25 | 1.06 | —*⁵ |
| voltage | G | 1.15 | 1.27 | 1.12 | —*⁶ |
| (1000 cd/m²) | B | 1.00 | 1.01 | 1.36 | 1.00 |
| Normalized | R | 0.72 | 0.13 | 0.91 | —*⁵ |
| lifetime | G | 0.74 | 0.38 | 0.66 | —*⁶ |
| (LT80) | B | 1.00 | 0.51 | 0.01 | 1.00 |

*¹Numerical data of Red is normalized by values of Comparative Example 4R.
*²Numerical data of Green is normalized by values of Comparative Example 4G.
*³Numerical data of Blue is normalized by values of Comparative Example 4B.
*⁴Bold-faced values indicate unsatisfactory characteristics.
Determination criteria for unsatisfactory characteristics are as follows:
The colors, R, G, and B pixels are not red, green, and blue, respectively.
The normalized current efficiency is less than 0.70.
The normalized voltage is 1.20 or more.
The normalized lifetime is less than 0.60.
*⁵It is meaningless to show a numerical value because blue light, instead of normal red light, is emitted.
*⁶It is meaningless to show a numerical value because blue light, instead of normal green light, is emitted.

TABLE 2

| Element structure | | Example 2 |
|---|---|---|
| Color | R | Red |
| (10 cd/m²) | G | Green |
| | B | Blue |
| Normalized current | R | 0.93 |
| efficiency | G | 0.94 |
| (1000 cd/m²) | B | 1.00 |
| Normalized voltage | R | 1.02 |
| (1000 cd/m²) | G | 1.07 |
| | B | 1.00 |
| Normalized lifetime | R | 0.65 |
| (LT80) | G | 0.69 |
| | B | 1.00 |

*1 Numerical data of Red is normalized by values of Comparative Example 7R.
*2 Numerical data of Green is normalized by values of Comparative Example 7G.
*3 Numerical data of Blue is normalized by values of Comparative Example 7B.

Tables 1 and 2 indicate that in the display device of each of the examples, the red light-emitting function layer 305R in the red light-emitting element 301R, the green light-emitting function layer 305G in the green light-emitting element 301G, and the blue light-emitting function layer 305B in the blue light-emitting element 301B selectively emit lights. This is because the first electron injection layer 361 and the hole transport layer 343 are interposed as the carrier selection layer between the red light-emitting function layer 305R and the blue light-emitting function layer 305B in the red light-emitting element 301R, between the green light-emitting function layer 305G and the blue light-emitting function layer 305B in the green light-emitting element 301G, and between the hole injection layer 341B and the blue light-emitting function layer 305B in the blue light-emitting element 301B. As a result, the red, green, and blue light-emitting elements 301R, 301G, and 301B emit red, green, and blue lights, respectively, with high color purity. In addition, all the red, green, and blue light-emitting elements 301R, 301G, and 301B show a normalized current efficiency of as high as 0.89 or more in Example 1 and as high as 0.93 or more in Example 2, and thus these elements have good luminous efficiency. Further, all the red, green, and blue light-emitting elements 301R, 301G, and 301B show a good normalized lifetime of 0.72 or more in Example 1 and 0.65 or more in Example 2 and thus have longer lifetime. In addition, in the red and green light-emitting elements 301R and 301G, the normalized voltage is suppressed to 1.15 or less in Example 1 and 1.07 or less in Example 2, and thus good characteristics are achieved from the viewpoint of the drive voltage.

In the display device of Comparative Example 1, the first electron injection layer 361 and the hole transport layer 343 of Examples 1 and 2 are omitted. Therefore, in the red light-emitting element 401R and the green light-emitting element 401G, electrons are not smoothly injected into the red light-emitting function layer 405R and the green light-emitting function layer 405G, respectively, from the blue light-emitting function layer 405B. This results in emission of not only red and green lights but also blue light. Therefore, in the red light-emitting element 401R and the green light-emitting element 401G, the color purities of red and green lights are significantly decreased. This is because in the red light-emitting element 401R and the green light-emitting element 401G of Comparative Example 1, electrons are not sufficiently injected into the red light-emitting function layer 405R and the green light-emitting function layer 405G, respectively, from the blue light-emitting function layer 405B. As a result, not only the red light-emitting function layer 405R and the green light-emitting function layer 405G but also the blue light-emitting function layer 405B simultaneously emit lights.

Further, in Comparative Example 1, the red light-emitting element 401R and the green light-emitting element 401G show normalized lifetime values (LT80) of as low as 0.13 and 0.38, respectively. This is possibly because in the red light-emitting element 401R and the green light-emitting element 401G of Comparative Example 1, electrons are not sufficiently injected into the red light-emitting function layer 405R and the green light-emitting function layer 405G, respectively, from the blue light-emitting function layer 405B. Thus, the cathode 408-side interfaces of the red light-emitting function layer 405R and the green light-emitting function layer 405G greatly deteriorate due to electrons.

Also, the blue light-emitting element 401B of Comparative Example 1 shows a normalized lifetime value of as low as 0.51. This is because the hole transport layer 443B of the blue light-emitting element 401B of Comparative Example 1 is formed by an ink jet method. That is, by using a vapor-phase process such as a vacuum deposition method, the blue light-emitting function layer 405B can be continuously deposited without exposure of the cathode 408-side interface of the hole transport layer 443B to an atmosphere other than a vacuum. However, in a liquid-phase process such as an ink jet method, it is difficult to deposit the hole transport layer 443B in a vacuum atmosphere, and thus the hole transport layer 443B is deposited in an atmosphere (e.g., air or nitrogen) other than a vacuum atmosphere. Therefore, at least the cathode 408-side interface of the hole transport layer 443B is exposed to an atmosphere other than a vacuum. When the hole transport layer 443B is deposited by the liquid-phase process, the cathode 408-side interface of the hole transport layer 443B is easily contaminated, thereby decreasing the lifetime of the blue light-emitting element 401B. In addition, when the hole transport layer 443B is deposited by the liquid-phase process, a solution prepared by dissolving a hole-transporting material in a solvent is used, and thus a trace amount of the solvent remains in the hole transport layer 443B, and thus the whole hole transport layer 443B is contaminated with the solvent, thereby decreasing the lifetime of the blue light-emitting element 401B.

Further, in Comparative Example 1, the red light-emitting element 401R and the green light-emitting element 401G show normalized voltage values of as high as 1.25 and 1.27, respectively. This is possibly because in the red light-emitting element 401R and the green light-emitting element 401G of Comparative Example 1, electrons are not sufficiently injected into the red light-emitting function layer 405R and the green light-emitting function layer 405G, respectively, from the blue light-emitting function layer 405B. Thus, in the red light-emitting function layer 405R and the green light-emitting function layer 405G, the energy barrier to electrons at the cathode 408-side interface is increased, resulting in an increase in drive voltage by 20% or more.

In the display device of Comparative Example 2, the hole transport layer 343 of Examples 1 and 2 is omitted. However, in the red light-emitting element 501R and the green light-emitting element 501G, the first electron injection layer 561 is present between the blue light-emitting function layer 505B and the red light-emitting function layer 505R and the green light-emitting function layer 505G, and thus electrons are smoothly injected into the red light-emitting function layer 505R and the green light-emitting function layer 505G, respectively, from the blue light-emitting function layer 505B. Consequently, in the red light-emitting element 501R, only the red light-emitting function layer 505R selectively emits light, and in the green light-emitting element 501G, only the green light-emitting function layer 505G selectively emits light. In addition, light emission of the blue light-emitting function layer 505B can be suppressed. However, the blue light-emitting element 501B has a structure in which the first electron injection layer 561 is in contact with the blue light-emitting function layer 505B, and thus light emission of the blue light-emitting function layer 505B is inhibited by the first electron injection layer 561. This results in extremely low values of normalized current efficiency and normalized lifetime and characteristics far away from practical levels. Further, the extremely low value of current efficiency causes a significant increase in drive voltage to 1.36.

In the display device of Comparative Example 3, the first electron injection layer 361 of Examples 1 and 2 is omitted.

Therefore, in the red light emitting element 601R, electrons are not smoothly injected into the hole transport layer 643 from the blue light-emitting function layer 605B and into the red light-emitting function layer 605R from the hole transport layer 643. Consequently, the red light-emitting function layer 605R little emits light and the blue light-emitting function layer 605B strongly emits light.

Similarly, in the green light emitting element 601G of the display device of Comparative Example 3, electrons are not smoothly injected into the hole transport layer 643 from the blue light-emitting function layer 605B and into the green light-emitting function layer 605G from the hole transport layer 643. Consequently, the green light-emitting function layer 605G little emits light and the blue light-emitting function layer 605B strongly emits light.

That is, in the display device of Comparative Example 3, all the red light-emitting element 601R, the green light-emitting element 601G, and the blue light-emitting element 601B emit blue light.

The results of the examples and the comparative examples are summarized as follows. First, in Examples 1 and 2 and Comparative Example 2, desired luminescent colors and a practical level of normalized lifetime of 0.60 or more can be achieved in the red light-emitting element and the green light-emitting element. However, in Comparative Example 2, the blue light-emitting element 501B has a very low current efficiency and a very short lifetime. Therefore, the display device of Comparative Example 2 does not reach the practical level.

Next, in Examples 1 and 2 and Comparative Example 3, a desired luminescent color and a practical level of normalized lifetime of 0.60 or more can be achieved in the blue light-emitting element. However, in Comparative Example 3, the red light-emitting element 601R and the green light-emitting element 601G emit blue light. Therefore, the display device of Comparative Example 3 does not reach the practical level.

Therefore, the display devices of only Examples 1 and 2 reach the practical level.

In Examples 1 and 2 of the present invention, desired colors are obtained from all the red light-emitting element 301R, the green light-emitting element 301G, and the blue light-emitting element 301B because a laminate of the first electron injection layer 361 and the hole transport layer 343 functions as a carrier selection layer. Also, in Examples 1 and 2 of the present invention, a practical level of normalized lifetime of 0.60 or more is obtained in the red light-emitting element 301R and the green light-emitting element 301G because a laminate of the first electron injection layer 361 and the hole transport layer 343 functions as a carrier selection layer. Further, in Examples 1 and 2 of the present invention, a practical level of normalized lifetime of 0.60 or more is obtained in the blue light-emitting element 301B because a laminate of the first electron injection layer 361 and the hole transport layer 343 functions as a carrier selection layer, and the hole transport layer 343 and the blue light-emitting function layer 305B are formed by the vacuum deposition method.

In comparison between Comparative Examples 1 and 3, in Comparative Example 3, the blue light-emitting element 601B including the hole transport layer 643 formed by the vacuum deposition method has a lifetime of about two times as long as that of the blue light-emitting element 401B including the hole transport layer 443B formed by the ink jet method in Comparative Example 1. Thus, the emission lifetime of the blue light-emitting element 601B of Comparative Example 3 reaches the practical level. Further, in comparison between Example 1 and Comparative Example 3, the blue light-emitting element 301B of Example 1 has an emission lifetime equivalent to that of the blue light-emitting element 601B of Comparative Example 3. Thus, it is found that the emission lifetime of the blue light-emitting element 301B of Example 1 reaches the practical level. This is due to the fact that like the hole transport layer 643 and the blue light-emitting function layer 605B in Comparative Example 3, the hole transport layer 343 and the blue light-emitting function layer 305B in Example 1 are formed by the vacuum deposition method.

Similarly, in comparison between the blue light-emitting elements of Example 2 and Comparative Example 7B, the blue light-emitting element 301B of Example 2 has an emission lifetime equivalent to that of the blue light-emitting element 901B of Comparative Example 7B. Thus, it is found that the emission lifetime of the blue light-emitting element 301B of Example 2 reaches the practical level. This is due to the fact that like the hole transport layer 943B and the blue light-emitting function layer 905B in Comparative Example 7B, the hole transport layer 343 and the blue light-emitting function layer 305B in Example 2 are formed by the vacuum deposition method.

In addition, on the basis of the values measured according to the above-described method for measuring current efficiency, the current efficiency of the blue light-emitting element 601B of Comparative Example 3 and the current efficiency of the blue light-emitting element 301B of Example 1 were determined by normalizing by the current efficiency of the blue light-emitting element 601B of Comparative Example 3. Further, the current efficiency of the blue light-emitting element 2101B of Comparative Example 5B and the current efficiency of the blue light-emitting element 2201B of Comparative Example 6B were determined by normalizing by the current efficiency of the blue light-emitting element 2101B of Comparative Example 5B.

The results are shown in Tables 3 and 4.

TABLE 3

| Presence of first electron injection layer | No (Comparative Example 3) | Yes (Example 1) |
|---|---|---|
| Normalized current efficiency (1000 cd/m$^2$) | 1.00 | 1.01 |

* Normalized by a value in the case (Comparative Example 3) of no first electron injection layer.

TABLE 4

| Presence of first electron injection layer | No (Comparative Example 5B) | Yes (Comparative Example 6B) |
|---|---|---|
| Normalized current efficiency (1000 cd/m$^2$) | 1.00 | 0.09 |

* Normalized by a value in the case (Comparative Example 5B) of no first electron injection layer.

Table 3 shows the influence of the presence of the first electron injection layer 361 on the current efficiencies of the blue light-emitting elements 601B and 301B when the hole injection layers 641B and 341B of the blue light-emitting elements 601B and 301B, respectively, are composed of an ion-conducting hole-injecting material. On the other hand, Table 4 shows the influence of the presence of the first electron injection layer 2261B on the current efficiencies of the blue light-emitting elements 2101B and 2201B when the hole injection layers 2141B and 2241B of the blue light-emitting elements 2101B and 2201B, respectively, are not composed of an ion-conducting hole-injecting material.

Table 3 reveals that when the hole injection layers 641B and 341B are composed of an ion-conducting hole-injecting material, the current efficiency of the blue light-emitting element 301B having the first electron injection layer 361 is substantially the same as that of the blue light-emitting element 601B not having the first electron injection layer 361. On the other hand, Table 4 reveals that when the hole injection layers 2141B and 2241B are not composed of an ion-conducting hole-injecting material, the current efficiency of the blue light-emitting element 2201B having the first electron injection layer 2261B is significantly lower that of the blue light-emitting element 2101B not having the first electron injection layer 2261B.

That is, these results indicate that even in the same laminated structure (laminate) of hole injection layer/electron injection layer/hole transport layer/blue light-emitting function layer/electron transport layer, blue emission of the blue light-emitting element 2201B is significantly inhibited by the presence of the first electron injection layer 2261B unless the hole injection layer is composed of an ion-conducting hole-injecting material.

This indicates that when the hole injection layer 2241B is not composed of an ion-conducting hole-injecting material, the electron-injecting material contained in the first electron injection layer 2261B diffuses into the hole transport layer 2243B and the blue light-emitting function layer 2205B, thereby inhibiting blue emission of the blue light-emitting function layer 2205B.

On the other hand, when the hole injection layer 341B is composed of an ion-conducting hole-injecting material, the electron-injecting material contained in the first electron injecting layer 361 mainly diffuses into the hole injection layer 341B or adsorbs on the cathode 308-side interface of the hole injection layer 341B, thereby significantly suppressing diffusion into the hole transport layer 343 and the blue light-emitting function layer 305B.

That is, in Examples 1 and 2, in order to emit light, with a high current efficiency (luminous efficiency) from the blue light-emitting element 301B including the carrier selection layer including the laminate of the first electron injection layer 361 and the hole transport layer 343, it is necessary to use an ion-conducting hole-injecting material for the hole injection layer 341B.

Besides the above-described embodiments, various modifications can be made. Hereinafter, modified examples are described.

Modified Example 1

In the embodiment, description is made of the case where in the light-emitting elements 1R, 1G, and 1B, the third layers of the light-emitting elements 1R and 1G are the red light-emitting function layer 5R and the green light-emitting function layer 5G, respectively, and the first layer is the blue light-emitting function layer 5B. However, the application range of the present invention is not limited to this case, and the third and first layers of each of the light-emitting elements 1R and 1G may be light-emitting function layers with different luminescent colors. For example, the third layers of the light-emitting elements 1R and 1G may be yellow and orange light-emitting layers, respectively, and the first layer may be a green light-emitting layer. In this case, the light-emitting element 1R is provided with a yellow light-emitting function layer in place of the red light-emitting function layer 5R, and the light-emitting element 1G is provided with an orange light-emitting function layer in place of the green light-emitting function layer 5G. Further, the light-emitting elements 1R and 1G are provided with a green light-emitting function layer in place of the blue light-emitting function layer 5B.

However, as in the embodiment, it is preferred that in the light-emitting elements 1R and 1G, the red light-emitting function layer 5R and the green light-emitting function layer 5G are used as the third layers, and the blue light-emitting function layer 5B is used as the first layer.

Modified Example 2

In the embodiment, description is made of the case where the display device 100 is applied to a display panel with a bottom-emission structure in which light is emitted from the substrate 21 side. However, application is not limited to this, and the display device 100 can also be applied to a display panel with a top-emission structure in which light is emitted from the sealing substrate 20 side. In this case, the color reproduction range of the display device 100 can be improved.

Modified Example 3

In the embodiment, the display device 100 does not include color filters (color conversion layers) corresponding to lights R, G, and B provided for transmitting the lights from the substrate 21 side. However, the display device 100 may have a structure having color filters which are provided on a surface in contact with the substrate 21 or inside the substrate 21 so as to correspond to the respective sub-pixels 100R, 100G, and 100B. In this case, the color reproduction range of the display device 100 can be improved.

What is claimed is:

1. A display device comprising:
   a first light-emitting element and a second light-emitting element, the first light-emitting element including:
     a first anode;
     a cathode;
     a first layer provided between the first anode and the cathode and having the function of emitting light of a first color;
     a second layer provided between the first anode and the first layer and having the function of flowing carriers; and
     a third layer provided between the first anode and the second layer and having the function of emitting light of a second color;
   the second light-emitting element including:
     a second anode;
     the cathode provided in common to the first light-emitting element;
     a fourth layer provided between the second anode and the cathode and having the function of emitting light of the first color;
     a fifth layer provided between the second anode and the fourth layer and having the function of suppressing a flow of carriers; and
     a first hole injection layer provided between the second anode and the fifth layer.

2. The display device according to claim 1, the second layer including:
   a first hole transport and a first electron injection layer, the first electron injection layer being disposed between the first hole transport layer and the first anode.

3. The display device according to claim 1, the fifth layer including:
   a second hole transport layer and a second electron injection layer, the second electron injection layer being disposed between the second hole transport layer and the second anode.

4. The display device according to claim 2, the first hole transport layer and the second hole transport layer being integral, and the first electron injection layer and the second electron injection layer being integral.

5. The display device according to claim 1, the first layer and the fourth layer being integral.

6. The display device according to claim 2, each of the first electron injection layer and the second electron injection layer including an alkali metal, an alkaline earth metal, or a compound thereof.

7. The display device according to claim 1, the first hole injection layer having ionic conductivity.

8. The display device according to claim 1, the first layer and fourth layer being formed by a vapor-phase process.

9. The display device according to claim 3, the second hole transport layer being formed by a vapor-phase process.

10. The display device according to claim 1, the third layer being formed by a liquid-phase process.

11. The display device according to claim 1, the first hole injection layer being formed by a liquid-phase process.

12. The display device according to claim 1, the first color being blue.

13. The display device according to claim 1, the second color being either red or green.

14. The display device according to claim 1, the first light-emitting element being configured to emit light of the second color, and the second light-emitting element being configured to emit light of the first color.

15. An electronic apparatus comprising the display device according to claim 1.

* * * * *